(12) United States Patent
Kunikiyo

(10) Patent No.: US 6,661,065 B2
(45) Date of Patent: Dec. 9, 2003

(54) SEMICONDUCTOR DEVICE AND SOI SUBSTRATE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 45 days.

(21) Appl. No.: 09/781,157

(22) Filed: Feb. 13, 2001

(65) Prior Publication Data

US 2002/0047169 A1 Apr. 25, 2002

(30) Foreign Application Priority Data

Sep. 1, 2000 (JP) ...................... P2000-265228

(51) Int. Cl.$^7$ .............................................. H01L 29/76
(52) U.S. Cl. ........................ 257/411; 257/347; 257/510
(58) Field of Search ................... 257/411, 510, 257/347

(56) References Cited

U.S. PATENT DOCUMENTS

| | | | | |
|---|---|---|---|---|
| 5,066,993 A | * | 11/1991 | Miura et al. ................. | 257/347 |
| 5,972,765 A | | 10/1999 | Clark et al. ................. | 438/308 |
| 6,023,093 A | * | 2/2000 | Gregor et al. ............... | 257/632 |
| 6,071,751 A | | 6/2000 | Wallace et al. .............. | 438/38 |
| 6,087,229 A | * | 7/2000 | Aronowitz et al. .......... | 257/411 |
| 6,143,634 A | | 11/2000 | Wallace et al. ............. | 438/585 |
| 6,281,138 B1 | * | 8/2001 | Brady et al. ................. | 438/762 |

FOREIGN PATENT DOCUMENTS

| | | |
|---|---|---|
| JP | 5-13756 | 1/1993 |
| JP | 5-283679 | 10/1993 |
| JP | 7-254704 | 10/1995 |
| JP | 8-316442 | 11/1996 |
| JP | 11-87712 | 3/1999 |
| JP | 11-284183 | 10/1999 |

OTHER PUBLICATIONS

English translation of Japanese Kokai 11–284183.*
W. F. Clark, et al., Proceeding of IEDM, pp. 89–92, "Channel Hot–Electron and Hot–Hole Improvement in Al and Cu Multilevel Metel CMOS Using Deuterated Anneals and Passivating Films", 1999.
I. C. Kizilyalli, et al., Proceeding of IEDM, pp. 935–938, "Milti–Level Metal CMOS Manufacturing with Deuterium for Improved Hot Carrier Reliability", 1998.

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A systematized semiconductor device having a gate insulating film which can be formed thinner than a silicon oxide film and which is less susceptible to deterioration. Further, a semiconductor device having improved reliability in which an insulating film or a buried oxide film in an SOI substrate with improved hot carrier resistance is provided. A MOSFET has a gate insulating film composed of a two-layer film including a silicon oxide film containing deuterium and a silicon nitride film containing deuterium which are provided in this order on a silicon substrate and a gate electrode composed of a three-layer film including a doped polysilicon film, a barrier metal layer, and a metal film of tungsten are provided in this order on the silicon nitride film. A silicon nitride film is provided on the metal film and a coating insulating film covers the gate insulating film, gate electrode and silicon nitride film.

17 Claims, 33 Drawing Sheets

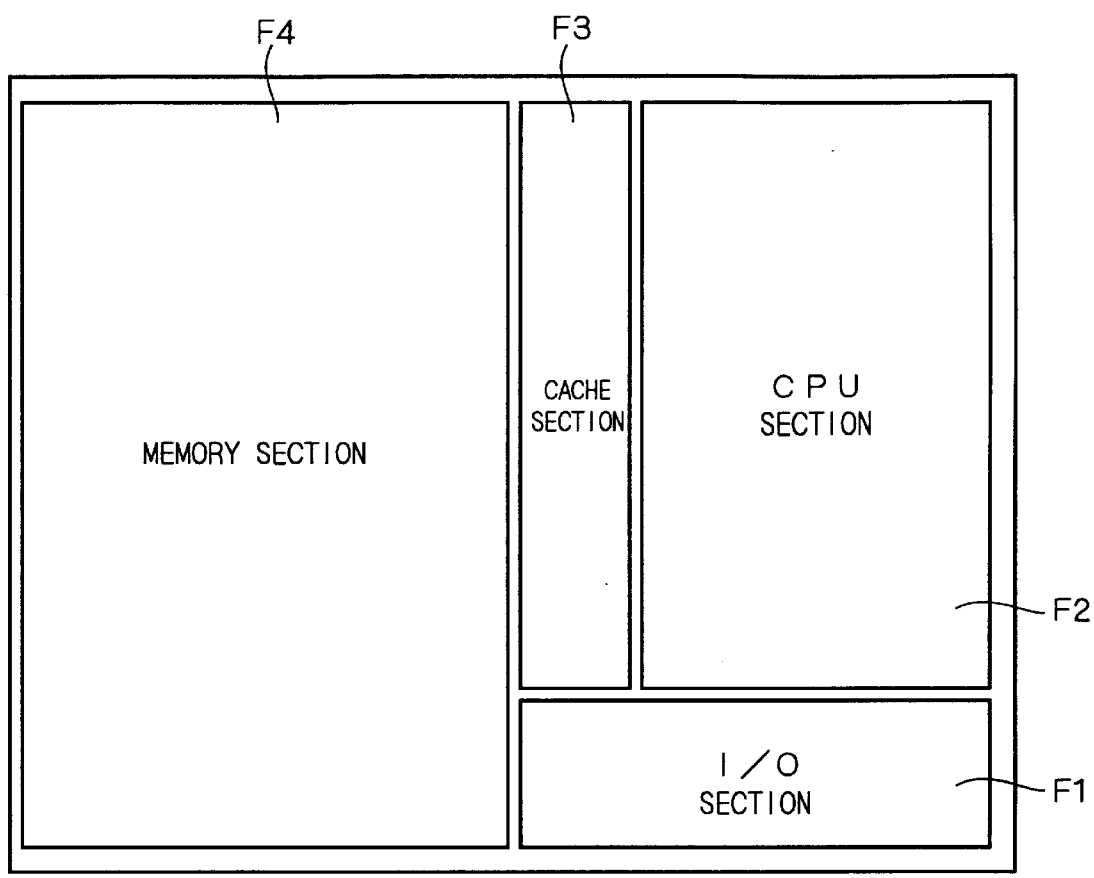

FIG. 44 (BACKGROUND ART)

| | N-TYPE MOSFET | | P-TYPE MOSFET | |
|---|---|---|---|---|
| | SURFACE CHANNEL TYPE | BURIED CHANNEL TYPE | SURFACE CHANNEL TYPE | BURIED CHANNEL TYPE |
| CHANNEL LAYER | B, BF$_2$, In | P, As, Sb | P, As, Sb | B, BF$_2$, In |
| CHANNEL STOPPER LAYER | B, BF$_2$, In | B, BF$_2$, In | P, As, Sb | P, As, Sb |
| MAIN SOURCE/DRAIN LAYER | P, As, Sb | P, As, Sb | B, BF$_2$, In | B, BF$_2$, In |
| EXTENSION LAYER | P, As, Sb | B, BF$_2$, In | B, BF$_2$, In | P, As, Sb |
| POCKET LAYER | B, BF$_2$, In | P, As, Sb | P, As, Sb | B, BF$_2$, In |
| DOPED POLYSILICON LAYER | P, As, Sb | P, As, Sb | B, BF$_2$, In | B, BF$_2$, In |

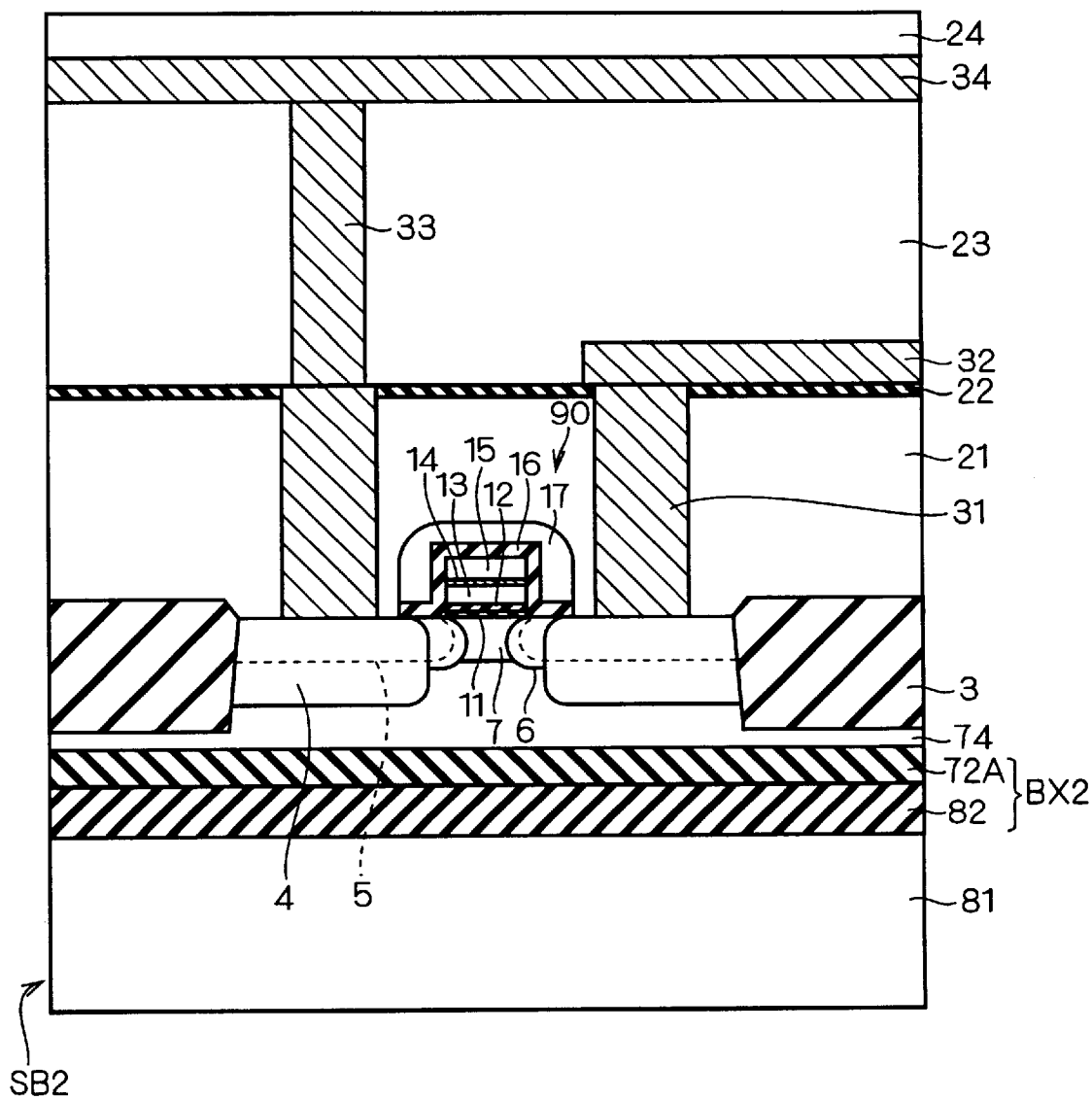
F I G. 5 0 (BACKGROUND ART)

SEMICONDUCTOR DEVICE AND SOI SUBSTRATE

BACKGROUND OF THE INVENTION

1. Field of the Invention

The present invention relates to semiconductor devices and SOI substrates, and particularly to a semiconductor device and an SOI substrate having improved insulating film and improved buried insulating film forming semiconductor elements.

2. Description of the Background Art

With miniaturization of MOSFETs (Metal Oxide Semiconductor Field Effect Transistors), attempts are being made to reduce the film thickness of gate insulating films for the purposes of improving the current driving capability and alleviating the roll-off of the threshold voltage (the amount of variation of the threshold voltage caused as the gate length and gate width vary).

There are two reasons behind this:

(1) Improving the current driving capability speeds up operation of the circuitry, thus increasing the operating frequency of the semiconductor chip.

(2) Alleviating the threshold voltage roll-off reduces variations of transistors' threshold voltages caused as the gate length and gate width vary during the process of transfer etc., thus facilitating the mass production.

Thinning a gate insulating film made of silicon oxide ($SiO_2$) to a thickness of 3 nm or less causes serious gate leakage current which is due to direct tunneling from the silicon substrate to the gate electrode. Therefore the film thickness of about 3 nm is the limit of the silicon oxide gate insulating film. However, there are demands for gate insulating films having film thicknesses of 3 nm or less, calculated in terms of silicon oxide film (referred to as reduced film thickness thereinafter), in order to improve the current driving capability.

Further, when a silicon oxide gate insulating film is formed in contact with a polysilicon film which heavily contains boron (which is used as a gate electrode in a surface-channel P-type MOSFET), boron in the polysilicon film thermally diffuses into the gate insulating film during thermal processing and reaches the channel to cause the threshold voltage to vary.

As a method for solving this problem, a MOSFET 90 as shown in FIG. 43 is used in the generation of gate length of 0.12 $\mu$m or less, for example.

In FIG. 43, the MOSFET 90 has a gate insulating film composed of a two-layer film of a silicon oxide film 11 and a silicon nitride film 12 formed in order on the silicon substrate 1, and a gate electrode composed of a three-layer film of a doped polysilicon film 13, a barrier metal layer 14 (WNx, TiNx, Ta, TaN, etc.) and a metal film 15 formed in order on the silicon nitride film 12. The gate insulating film formed of a silicon oxide film and a silicon nitride film is referred to as ON (Oxide-Nitride) film hereinafter.

The MOSFET 90 has a coating insulating film 16 covering the gate insulating film and gate electrode, a sidewall insulating film 17 covering at least the sides of the coating insulating film 16, a channel layer 7 provided in the surface of the silicon substrate 1 under the gate electrode, a pair of extension layers 6 facing each other through the channel layer 7, pocket layers 5 provided in the pair of extension layers 6, and a pair of main source/drain layers 4 adjacent to the pair of extension layers 6. Although the extension layers 6 should be referred to as source/drain extension layers 6 since they have the same conductivity type as the main source/drain layers 4 and function as source/drain layers, they are called extension layers 6 for convenience.

The active region of the MOSFET 90 is defined by an STI (Shallow Trench Isolation) film 3, a kind of element isolation insulating film. A channel stopper layer 2 is provided in the silicon substrate 1 and a first interlayer insulating film 21, an insulating film 22, a second interlayer insulating film 23 and a third interlayer insulating film 24 are deposited over the MOSFET 90.

FIG. 43 shows a structure including contacts 31 passing through the first interlayer insulating film 21 and the insulating film 22 to reach the pair of main source/drain layers 4, a first interconnection layer 32 connected to one of the contacts 31, a contact 33 passing through the second interlayer insulating film 23 to reach the other contact 31, and a second interconnection layer 34 connected to the contact 33. This structure is just an example and other structures are also possible.

FIG. 44 shows, for reference, dopants used in individual layers of MOSFETs. FIG. 44 classifies N-type MOSFET and P-type MOSFET each into surface channel type and buried channel type and lists dopants which can be used in the channel layer, channel stopper layer, main source/drain layers, extension layers, pocket layers and doped polysilicon layer.

Next, advantages of the above-described ON film are described. The ON film has the following two advantages:

(1) Under the condition that the gate current due to direct tunneling hardly flows, the reduced film thickness can be made thinner than 3 nm.

(2) It is free from variation of the threshold voltage caused by thermal diffusion of dopant in polysilicon: the dopant in polysilicon does not thermally diffuse in the gate insulating film to reach the channel since the dopant diffusion coefficient in the silicon nitride is much smaller than that in silicon oxide.

While attempts have been made to form a silicon nitride film as the gate insulating film on the silicon substrate, this strategy has not been put in practice since the interface state density increases at the silicon nitride/silicon substrate interface. When the interface state density increases, the mobility and effective carrier density decrease as carriers moving in MOSFET repeat trap/de-trap, which reduces the drain current. This in turn reduces the operating speed of the semiconductor integrated circuit formed of the MOSFETs.

While the ON film has many advantages as described above, it has some problem with hot carrier resistance.

FIGS. 45 to 47 are schematic diagrams used to explain the mechanism of hot-carrier-induced deterioration of an ON film formed on a silicon substrate. Hydrogen atoms are introduced into the ON film during formation of the silicon oxide film or during subsequent processing (hydrogen sintering etc.) and they combine with part of silicon atoms in the silicon oxide film of the ON film as shown in FIG. 45. FIG. 45 shows bonded structures of a silicon atom (Si) and a hydroxyl group (OH). Three atoms shown by R are bonded to a silicon atom by single bond. This shows that three atoms of oxygen (O), hydrogen (H), silicon, etc. are bonded through single bond. This expression is used also in FIGS. 47 and 48.

Hydrogen atoms are introduced also into the silicon nitride film during formation of the film or subsequent processing. The hydrogen atoms introduced in the process of hydrogen sintering etc. join and terminate dangling bonds of silicon atoms at the $SiO_2$/Si interface.

When stress voltage is applied to the MOSFET (for example, with an N-type MOSFET, power-supply voltage VDD to the drain and gate and 0 V or base power-supply voltage VBB=−1 V to the source), hot carriers HOT in the silicon substrate, which have been accelerated by the internal electric field and gained energy larger than the barrier energy at the $SiO_2/Si$ interface, pass through the interface into $SiO_2$ as shown in FIG. 45.

Due to the energy of the hot carriers HOT, the bonds of hydrogen atoms of hydroxyl groups bonded to silicon atoms are cut and the dangling bonds of oxygen function as fixed charges.

As shown in FIG. 46, the hydrogen atoms freed from the bonds reach the $SiO_2/Si$ interface because of drift caused by the electric field in the gate insulating film or thermal diffusion. The hydrogen atoms which have arrived at the interface react with the combined structure of Si atoms and hydrogen atoms at the interface to form hydrogen molecules.

These hydrogen molecules volatilize as gas and as shown in FIG. 47 the dangling bonds of silicon atoms at the $SiO_2/Si$ interface function as interface states, and the dangling bonds of silicon atoms in the silicon oxide film function as fixed charges.

Formation of the fixed charges or interface states causes threshold voltage variation, drain current deterioration, etc., which reduces the operating speed of the circuit or causes malfunction of the circuit.

While hydrogen atoms in the silicon oxide film deteriorate the ON film through the mechanism described above, hydrogen atoms in the silicon nitride film deteriorate the ON film through the following mechanism.

The silicon nitride film of the ON film is usually formed by chemical reactions expressed by Formulas (1) and (2).

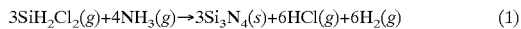

$$3SiH_2Cl_2(g)+4NH_3(g) \rightarrow 3Si_3N_4(s)+6HCl(g)+6H_2(g) \quad (1)$$

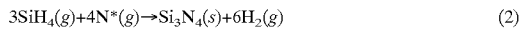

$$3SiH_4(g)+4N^*(g) \rightarrow Si_3N_4(s)+6H_2(g) \quad (2)$$

Formula (1) shows a reaction in a CVD reaction device or RTN (Rapid Thermal Nitridation) device and Formula (2) shows a reaction by plasma excitation. N* in Formula (2) represents the radical of a nitrogen atom.

As can be seen from Formulas (1) and (2), hydrogen gas is produced as a byproduct during formation of the silicon nitride film. Although it is represented as hydrogen molecules in the formulas above, part of them are introduced into the silicon nitride film during the reaction in the form of hydrogen atoms. Hydrogen atoms in the silicon nitride film exist in various forms: some may be combined with silicon atoms and some may exist in interstices of the silicon nitride lattice, for example.

FIG. 48 is a diagram showing the dependence of hydrogen atom content in silicon nitride film formed by using the reaction shown by Formula (1) on the partial pressure of ammonia gas; the horizontal axis shows the ratio of the partial pressure of ammonia gas to the total pressure in the reaction chamber and the vertical axis shows the hydrogen atom content (atomic %).

As can be seen from FIG. 48, the silicon nitride film contains hydrogen atoms of about 10 to 30 atomic %.

When an ON film is used as a gate insulating film, hydrogen atoms in silicon nitride move into the silicon oxide film because of drift or diffuse when a stress voltage is applied; as shown in FIG. 46, as well as hydrogen atoms in the silicon oxide film, they react with hydrogen atoms in hydroxyl groups bonded to silicon atoms to form hydrogen molecules, or react with the combined structure of Si atoms and hydrogen atoms at the $SiO_2/Si$ interface to form hydrogen molecules.

The hydrogen molecules volatilize as gas and, as shown in FIG. 47, the dangling bonds of silicon atoms at the $SiO_2/Si$ interface function as interface states and the dangling bonds of oxygen atoms in the silicon oxide film function as fixed charges. The gate insulating film thus has a property that it is deteriorated faster than a gate insulating film composed only of a silicon oxide film.

Particularly, the current tendency is toward thinner silicon oxide film and thicker silicon nitride film in order to lessen the reduced film thickness of ON film, so that the deterioration caused by hydrogen atoms in the silicon nitride film has become dominant to cause problems which cannot be neglected.

Further, semiconductor devices are being increasingly systematized and semiconductor devices having various functional blocks are now available, where different maximum voltages are applied to individual functional blocks such as a memory array section, input/output section, CPU section and logic section. It is therefore becoming difficult to satisfy the reliability of all gate insulating films with the same ON film.

The hot carrier resistance problem arises not only in such a gate insulating film as described above but also in an element isolation insulating film for making element isolation with a trench isolation structure such as STI film and in a buried oxide film in an SOI substrate (Silicon On Insulator), for example.

SUMMARY OF THE INVENTION

A first aspect of the present invention is directed to a semiconductor device having at least one kind of MOSFET, wherein the MOSFET comprises a gate insulating film provided on a main surface of a semiconductor substrate and a gate electrode provided on the gate insulating film, and the gate insulating film comprises a first two-layer film including a silicon oxide film and a silicon oxynitride film, at least one of the silicon oxide film and the silicon oxynitride film containing deuterium atoms, or a second two-layer film including a silicon nitride film and a silicon oxynitride film, at least one of the silicon nitride film and the silicon oxynitride film containing deuterium atoms.

Preferably, according to a second aspect, in the semiconductor device, the silicon oxynitride film in the first two-layer film is formed on the silicon oxide film, and the silicon nitride film in the second two-layer film is formed on the silicon oxynitride film.

Preferably, according to a third aspect, in the semiconductor device, the silicon oxynitride film in the first two-layer film is thicker than the silicon oxide film.

Preferably, according to a fourth aspect, in the semiconductor device, the silicon oxynitride film in the second two-layer film is thicker than the silicon nitride film.

Preferably, according to a fifth aspect, in the semiconductor device, in the first and second two-layer films, their respective first layers and second layers contain deuterium atoms.

Preferably, according to a sixth aspect, the semiconductor device has a plurality of functional blocks to which different maximum applied voltages are applied, and the at least one kind of MOSFET comprises a plurality of kinds of MOSFETs having the gate insulating films differing in thickness, wherein the plurality of kinds of MOSFETs are allotted to the plurality of functional blocks in accordance with the thicknesses of their gate insulating films so that the MOSFETs can keep the enough reliability subject to the respective maximum applied voltages.

Preferably, according to a seventh aspect, in the semiconductor device, the at least one kind of MOSFET further comprises a coating insulating film covering the multi-layered structure of the gate insulating film and the gate electrode and partially covering the main surface of the semiconductor substrate extend outwardly from sides of the multi-layered structure, and a sidewall insulating film covering the coating insulating film, wherein the coating insulating film contains deuterium atoms.

Preferably, according to an eighth aspect, in the semiconductor device, the coating insulating film is a silicon oxide film.

Preferably, according to a ninth aspect, in the semiconductor device, the coating insulating film is a silicon oxynitride film.

A tenth aspect is directed to a semiconductor device having a MOSFET, wherein the MOSFET comprises a gate insulating film provided on an active region defined by an element isolation insulating film provided in a main surface of a semiconductor substrate, and a gate electrode provided on the gate insulating film, wherein the element isolation insulating film comprises a trench formed in the main surface of the semiconductor substrate, an inner-wall insulating film provided on an inner-wall of the trench and containing deuterium atoms, and an insulating film buried in the trench covered by the inner-wall insulating film.

Preferably, according to an eleventh aspect, in the semiconductor device, the inner-wall insulating film is a silicon oxide film which contains deuterium atoms or a silicon oxynitride film which contains deuterium atoms.

Preferably, according to a twelfth aspect, in the semiconductor device, the insulating film is a silicon oxide film which contains deuterium atoms or a silicon oxynitride film which contains deuterium atoms.

Preferably, according to a thirteenth aspect, in the semiconductor device, the inner-wall insulating film has its top edge raised to form a gentle curve on the main surface of the semiconductor substrate and the gate electrode of the MOSFET has its edge in the gate width direction engaged with the top edge of the inner-wall insulating film.

Preferably, according to a fourteenth aspect, in the semiconductor device, the semiconductor substrate is an SOI substrate which comprises a buried insulating film provided on a silicon substrate and an SOI layer provided on the buried insulating film, and the buried insulating film contains deuterium atoms.

According to a fifteenth aspect, an SOI substrate comprises: a buried insulating film provided on a silicon substrate, and an SOI layer provided on the buried insulating film, wherein the buried insulating film is a two-layer film comprising any two of a silicon oxide film, a silicon oxynitride film and a silicon nitride film.

Preferably, according to a sixteenth aspect, in the SOI substrate, the buried insulating film contains deuterium atoms.

Preferably, according to a seventeenth aspect, in the SOI substrate, the buried insulating film comprises a first layer adjacent to the SOI layer and a second layer underlying the first layer, and at least the first layer contains deuterium atoms.

Preferably, according to an eighteenth aspect, in the SOI substrate, the first layer is the silicon oxide film or the silicon oxynitride film.

According to a nineteenth aspect, a semiconductor device at least comprises a MOSFET provided on the SOI layer of the SOI substrate according to the fifteenth aspect.

According to the semiconductor device of the first aspect of the present invention, the gate insulating film has a first two-layer film including a silicon oxide film and a silicon oxynitride film in which at least one of the layers contains deuterium atoms, or a second two-layer film including a silicon nitride film and a silicon oxynitride film in which at least one of the layers contains deuterium atoms. Deuterium atoms, which are heavier than hydrogen atoms, drift or diffuse more slowly than hydrogen atoms from the first layer to the second layer or in the opposite direction. Therefore interface state generation is slow even when a stress voltage is applied. This enhances the reliability of the MOSFET. Further, since the bond energy between deuterium atoms and silicon atoms is larger than that between hydrogen atoms and silicon atoms, the deuterium atoms are less susceptible to dissociation from silicon atoms caused by hot carriers coming from the semiconductor substrate. Hence, forming the first two-layer film or second two-layer film which contain deuterium suppresses the hot-carrier-induced dissociation occurring when a stress voltage is applied, thus improving the hot carrier resistance under stress voltage, which lengthens the life of the MOSFET and improves the reliability.

According to the semiconductor device of the second aspect, the silicon oxide film is formed on the semiconductor substrate when the first two-layer film is used, and the silicon oxynitride film is formed on the semiconductor substrate when the second two-layer film is used. This prevents an increase in interface state density at the interface with the semiconductor substrate.

According to the semiconductor device of the third aspect, the silicon oxynitride film having a larger relative dielectric constant is thicker than the silicon oxide film. This increases the capacitance of the gate insulating film, which in turn improves the operating speed of the circuit.

According to the semiconductor device of the fourth aspect, the silicon oxynitride film is thicker than the silicon nitride film, so that the stress at the substrate interface can be reduced, leading to the reduction of the interface state density and defect density.

According to the semiconductor device of the fifth aspect, in the first and second two-layer films, their respective first layers and second layers contain deuterium atoms. This slows down interface state generation even when a stress voltage is applied, thus improving the reliability of the MOSFET. Further, deuterium atoms are less susceptible to dissociation from silicon atoms caused by hot carriers from the semiconductor substrate. This suppresses the hot-carrier-induced dissociation under stress voltage, thus improving the hot carrier resistance under stress voltage, which lengthens the life of the MOSFET and improves the reliability.

According to the semiconductor device of the sixth aspect, a plurality of kinds of MOSFETs are allotted to a plurality of functional blocks in accordance with the thicknesses of their gate insulating films so that they can keep the reliability subject to the respective maximum applied voltages. The gate insulating films can be adjusted in thickness in accordance with the maximum applied voltages to the plurality of functional blocks by adjusting the film thickness of one layer or both layers in each gate insulating film, so as to optimize the operating speed and reliability for each individual functional block.

According to the seventh aspect, the semiconductor device further comprises a coating insulating film covering the multi-layered structure of the gate insulating film and the gate electrode and partially covering the main surface of the semiconductor substrate extend outwardly from sides of the multi-layered structure, and a sidewall insulating film covering the coating insulating film, and the coating insulating film contains deuterium atoms. The deuterium atoms in the film join and terminate dangling bonds of silicon atoms in the film and join and terminate dangling bonds of silicon atoms at the interface with the silicon substrate, thus reducing the trap density and interface state density. Since the coating insulating film is adjacent to the gate insulating film in some area, the use of the deuterium-containing insulating film which can reduce dangling bonds avoids adverse effects on the gate insulating film.

According to the semiconductor device of the eighth aspect, the coating insulating film is a silicon oxide film. Therefore it can be formed by various methods, as TEOS oxide film, HDP oxide film, thermal oxide film, etc.

According to the semiconductor device of the ninth aspect, the coating insulating film is a silicon oxynitride film which has resistance to oxidation. This prevents the film thickness from varying because of oxidation.

According to the semiconductor device of the tenth aspect, the element isolation insulating film comprises an inner-wall insulating film provided on the inner-wall of a trench and containing deuterium atoms and an insulating film buried in the trench covered by the inner-wall insulating film. Deuterium terminates dangling bonds in the inner-wall insulating film. Dissociation of deuterium atoms from silicon atoms due to hot carriers coming from the semiconductor substrate is less likely to occur, which fact suppresses interface state generation and trap generation at the interface between the inner-wall insulating film and the substrate. Therefore, when a gate electrode is engaged with it, the hot carrier resistance and reliability are improved.

According to the semiconductor device of the eleventh aspect, the inner-wall insulating film is a silicon oxide film which contains deuterium atoms or a silicon oxynitride film which contains deuterium atoms. These films can be formed relatively easily.

According to the semiconductor device of the twelfth aspect, the insulating film is a silicon oxide film which contains deuterium atoms or a silicon oxynitride film which contains deuterium atoms. This provides the effect of preventing deuterium in the inner-wall insulating film from volatilizing in subsequent thermal processing.

According to the semiconductor device of the thirteenth aspect, a top edge of the inner-wall insulating film is raised to form a gentle curve on the main surface of the semiconductor substrate and an edge in the gate width direction of the gate electrode of the MOSFET is engaged with the top edge of the inner-wall insulating film. This prevents the problem that the electric field is concentrated at the edge in the gate width direction of the gate electrode to cause the MOSFET to turn on at voltage lower than the designed value of the threshold voltage.

According to the semiconductor device of the fourteenth aspect, the semiconductor substrate is composed of an SOI substrate and the buried insulating film contains deuterium atoms. The bond energy between silicon atoms and deuterium in the buried insulating film is larger than the bond energy between silicon atoms and hydrogen atoms, which fact suppresses interface state generation and fixed state generation. Thus the reliability of the MOSFET formed on the SOI substrate can be enhanced.

According to the SOI substrate of the fifteenth aspect, the semiconductor substrate is composed of an SOI substrate and the buried insulating film is a two-layer film comprising any two of a silicon oxide film, a silicon oxynitride film and a silicon nitride film. Accordingly, thermal stress can be alleviated by combining a silicon oxide film which generates expansile stress when heated and a silicon nitride film which generates compressive stress, for example. This structure introduces a smaller amount of thermal stress into the SOI layer than a buried insulating film having the same thickness and formed only of a silicon oxide film, which reduces interface state generation at the interface with the adjacent SOI layer. This reduces defects formed during manufacturing processing and reduces the leakage current of the semiconductor device.

According to the SOI substrate of the sixteenth aspect, the buried insulating film contains deuterium. When silicon atoms and deuterium are combined in the buried insulating film, their bond energy is larger than that between silicon atoms and hydrogen atoms, so that interface state generation and fixed state generation are less likely to occur. This improves the reliability of the semiconductor device formed on the SOI substrate.

According to the SOI substrate of the seventeenth aspect, the buried insulating film is divided into a first layer adjacent to the SOI layer and a second layer under the first layer, and at least the first layer contains deuterium atoms. This certainly reduces interface state and fixed state generation at the interface between the SOI layer and the buried insulating film, which improves the reliability of semiconductor device formed on the SOI substrate.

According to the SOI substrate of the eighteenth aspect, the first layer is the silicon oxide film or the silicon oxynitride film. The interface state density can be reduced than in a structure using a silicon nitride film.

According to the semiconductor device of the nineteenth aspect, the thermal stress exerted on the SOI layer can be reduced, which suppresses interface state generation at the interface with the adjacent SOI layer. This suppresses formation of defects during manufacturing processing and hence the leakage current of the MOSFET, thus providing a semiconductor device less susceptible to deterioration of operating characteristics.

The present invention has been made to solve the above-described problems and a first object of the invention is to provide a systematized semiconductor device having a gate insulating film which can be formed thinner than a silicon oxide film and which is less susceptible to deterioration.

A second object of the invention is to provide semiconductor devices with improved reliability in which such insulating films have improved hot carrier resistance.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an example of structure of a semiconductor device.

FIGS. 2A and 2B to 7A and 7B are schematic diagrams showing structures of gate insulating films according to the first preferred embodiment of the present invention.

FIG. 44 is a diagram showing various kinds of dopants used in individual layers of MOSFETs.

FIGS. 49 and 50 are sectional views showing structures of semiconductor devices in which a MOSFET is provided on an SOI substrate having a multilayer buried insulating film.

DESCRIPTION OF THE PREFERRED EMBODIMENTS

<A. First Preferred Embodiment>

<A-1. Device Structure>

<A-1-1. Block Structure of Semiconductor Device>

Figure 2A:
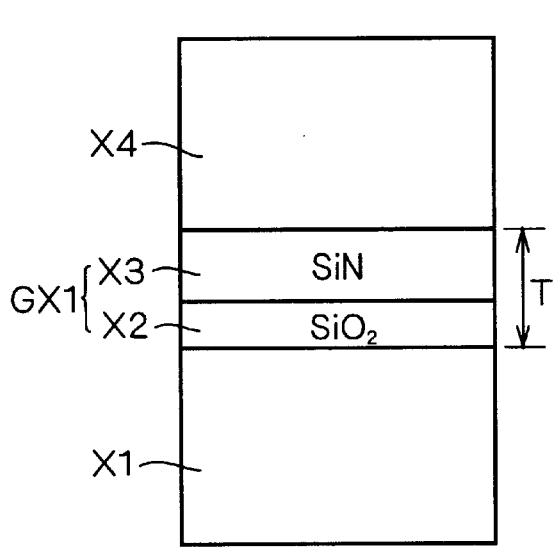

FIG. 1 is a block diagram showing an example of structure of a systematized semiconductor device, which has four circuit sections as functional blocks: an I/O section F1, a CPU (Central Processing Unit) section F2, a cache section F3 and a memory section F4.

The I/O section F1 has a function of making connections with external power-supply and external ground power-supply of the semiconductor device to transmit external signals into the semiconductor device and internal signals out of the semiconductor device.

It has a protecting circuit to control input/output signals so that the magnitudes of the signal voltage and signal current fall within the standards. When the input/output signals are transferred by a known communication/transmission system, it is further equipped with a circuit for modulating or demodulating the signals.

It also has a circuit for transforming the external power-supply voltage for the individual functional blocks and supplying the voltages to the functional blocks. For example, when the external power-supply voltage is 2V, this section supplies a power-supply voltage of 1.2 V to the CPU section F2 and cache section F3 and a power-supply voltage of 1.5 V to the memory section F4.

The memory section has a function of storing signal data; this section contains a plurality of memory cells arranged in an array to store one-bit or multi-bit information. This section also has a booster circuit for applying a boosted voltage to word lines, a sense amplifier circuit for detecting bit information, an address decoder/encoder circuit for specifying addresses of the memory cells, etc.

The memory cells are provided with word lines. When the word line potential is high, a boosted voltage somewhat higher than the power-supply voltage of the memory section is applied to correct the signal voltage drop corresponding to the threshold voltage of the memory cell transistors.

The memory cells can be constructed as any of DRAM, SRAM, FRAM (Ferroelectric Random Access Memory), flash EEPROM, MRAM (Magnetic Random Access Memory), etc.

The cache section has a function of adjusting data input/output between the CPU section and memory section, considering a difference in operating speed between the two sections.

The CPU section has a function of processing information on the basis of input information and outputting the processed information. The CPU section, which consumes large power, must achieve both of higher speed and lower power consumption. Accordingly it uses a voltage which is lower than the external power-supply voltage to such a degree so as not to largely reduce the speed. That is to say, while higher power-supply voltage is desirable to improve the speed since it enhances the current driving capability of MOSFETs, it largely increases the power consumption which is proportional to the square of the power-supply voltage.

A systematized semiconductor device has a structure as shown above, where maximum applied voltages differ among the individual functional blocks.

For example, MOSFETs forming the CPU section F2 are required to provide high current driving capability and therefore a thinner ON film is desirable as their gate insulating film.

On the other hand, when the power-supply voltage applied to the I/O section F1 is higher than the power-supply voltage of the CPU section F2, it is difficult to secure the reliability for a given period (e.g. ten years) by using ON films of the same thickness as gate insulating films in MOSFETs in the protecting circuit etc. in the I/O section F1 and in MOSFETs in the CPU section F1.

<A-1-2. First Example of Gate Insulating Film Structure for Securing Reliability>

The simplest measure for solving this problem and securing the reliability is to form thicker ON films in correspondence with the magnitudes of the maximum voltages applied to the individual functional blocks.

Figure 2B:
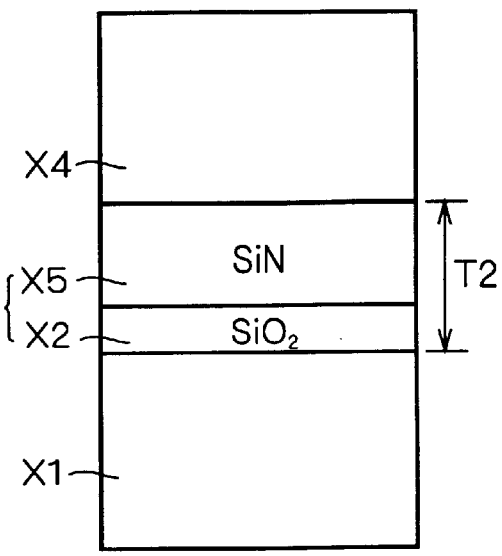

FIGS. 2A and 2B schematically show an example of gate insulating films and gate electrodes of MOSFETs in the CPU section F2 and I/O section F1, respectively.

In the structures shown in FIGS. 2A and 2B, gate insulating films GX1 and GX2 are formed on a semiconductor substrate X1 and a gate electrode X4 is formed on both of the gate insulating films GX1 and GX2.

The gate insulating film GX1 is composed of a silicon oxide film ($SiO_2$) X2 provided on the semiconductor substrate X1 and a silicon nitride film (SiN) X3 provided thereon, and the gate insulating film GX2 is composed of a silicon oxide film X2 provided on the semiconductor substrate X1 and a silicon nitride film X5 formed thereon.

The film thickness T2 of the gate insulating film GX2 in the I/O section F1 shown in FIG. 2B is larger than the film thickness T1 of the gate insulating film GX1 in the CPU section F2 shown in FIG. 2A. The silicon oxide films X2 have the same thickness and the silicon nitride film X5 is thicker than the silicon nitride film X3, so that the gate insulating film GX2 is thicker than the gate insulating film GX1.

In the memory section, a boosted voltage is applied to DRAM memory cell transistors, for example. Accordingly, the ON film used as gate insulating film of the memory cell transistors is formed thicker than the ON film used as gate insulating film of MOSFETs in the sense amplifier circuit and address decoder/encoder circuit.

The silicon nitride film has a relative dielectric constant of 6.5 to 9 and the silicon oxide film has a relative dielectric constant of 3.9 to 4.3, so that an ON gate insulating film having a thicker silicon nitride film has a larger capacitance. An increase in capacitance of the gate insulating film increases the drain current in saturation region, which in turn increases the operating speed of the circuit. Forming a thicker silicon nitride film in the ON film thus increases the operating speed of the circuit.

In a P-type MOSFET having a gate electrode made of a poly-metal gate in which a metal layer of tungsten (W) etc. is provided over a polysilicon layer with a barrier metal layer of tungsten nitride (WNx) etc. interposed therebetween, the polysilicon layer may be doped with boron. In this case, if the gate insulating film is a silicon oxide film of about 2 nm in thickness, boron may diffuse in the gate insulating film during thermal processing to reach the semiconductor substrate, thus possibly causing the threshold voltage of the P-type MOSFET to vary. This can be avoided by using the silicon nitride film which has a smaller boron diffusion coefficient. The use of an ON film having a thicker silicon nitride film is particularly suitable for prevention of the threshold voltage variation caused by boron penetrating through the gate insulating film.

The above-described setting of ON film thickness is just an example and other settings are also possible.

Figure 3A:
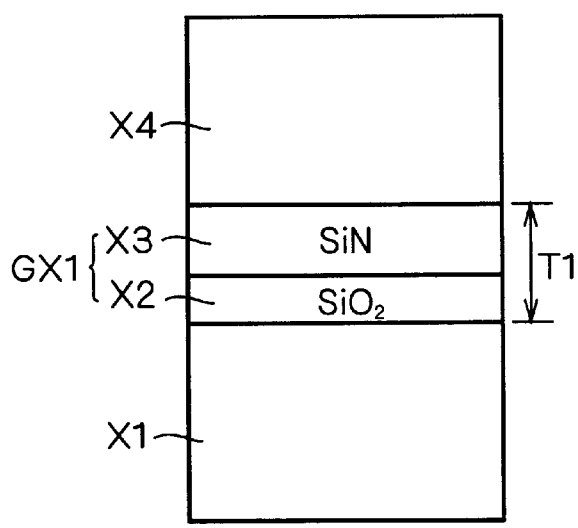
Figure 3B:
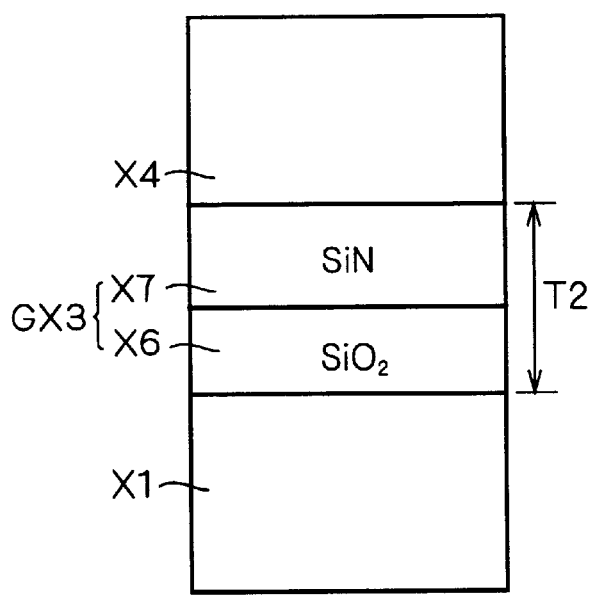

For example, FIGS. 3A and 3B schematically show another example of setting of ON film thickness in the CPU section F2 and I/O section F1, respectively.

In FIGS. 3A and 3B, gate insulating films GX1 and GX3 are formed on the semiconductor substrate X1 and the gate electrode X4 is formed on both of the gate insulating films GX1 and GX3.

While the gate insulating film GX1 is the same as that shown in FIG. 2A, the gate insulating film GX3 is composed of a silicon oxide film X6 provided on the semiconductor substrate X1 and a silicon nitride film X7 provided thereon.

The film thickness T2 of the gate insulating film GX3 in the I/O section F1 shown in FIG. 3B is thicker than the film thickness T1 of the gate insulating film GX1 in the CPU section F2 shown in FIG. 3A. The gate insulating film GX3 is thicker than the gate insulating film GX1 since the silicon oxide film X6 and silicon nitride film X7 are thicker than the silicon oxide film X2 and silicon nitride film X3.

Figure 4A:
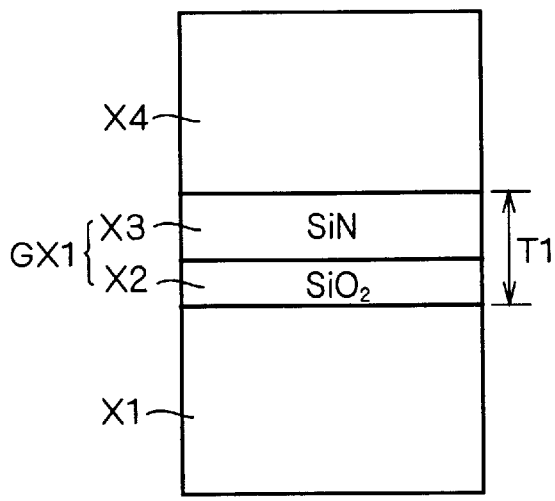
Figure 4B:
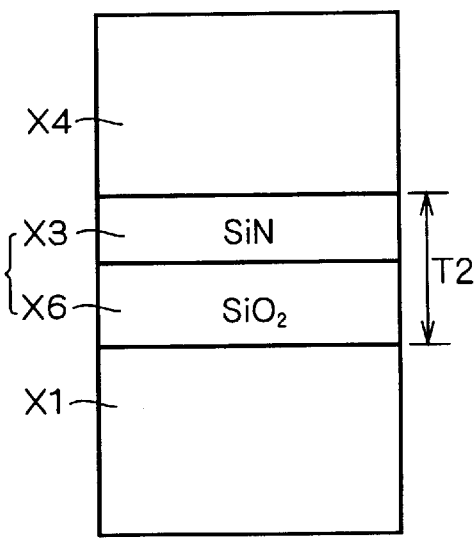

FIGS. 4A and 4B schematically show another example of ON film thickness setting in the CPU section F2 and I/O section F1, respectively.

In FIGS. 4A and 4B, gate insulating films GX1 and GX4 are formed on the semiconductor substrate X1 and the gate electrode X4 is formed on both of the gate insulating films GX1 and GX4.

While the gate insulating film GX1 is the same as that shown in FIG. 2A, the gate insulating film GX4 is composed of a silicon oxide film X6 provided on the semiconductor substrate X1 and a silicon nitride film X3 provided thereon.

The film thickness T2 of the gate insulating film GX4 in the I/O section F1 shown in FIG. 4B is thicker than the film thickness T1 of the gate insulating film GX1 in the CPU section F2 shown in FIG. 4A. The silicon nitride films X3 have the same thickness but the silicon oxide film X6 is thicker than the silicon oxide film X2, so that the gate insulating film GX4 is thicker than the gate insulating film GX1.

Thus forming the silicon nitride film thinner than the silicon oxide film provides the following function and effect. That is to say, while compressive stress occurs in the silicon oxide film and tensile stress occurs in the silicon nitride film, the tensile stress of the silicon nitride film is stronger. Accordingly, forming a thicker silicon nitride film causes larger stress at the interface between the ON film and semiconductor substrate, possibly increasing the interface state density or defect density. Therefore the stress at the substrate interface can be reduced to decrease the interface state density or defect density by forming the silicon nitride film thinner than the silicon oxide film.

The above-described examples of ON film thickness setting show the technical idea of forming a thicker ON film as a higher maximum voltage is applied thereto.

<A-1-3. Second Example of Gate Insulating Film Structure for Securing Reliability>

Figure 5A:
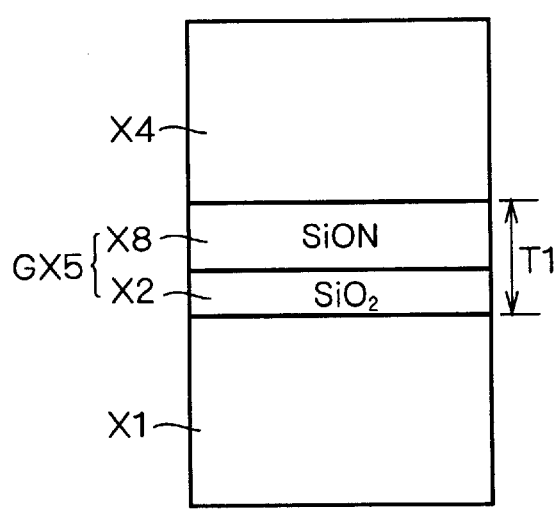
Figure 5B:
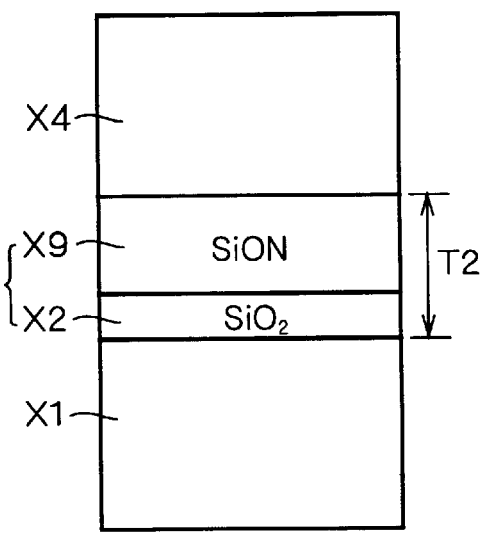

While the above-described structures for securing the reliability use an ON film as a gate insulating film, a multi-layered film having a silicon oxide film and a silicon oxynitride film (SiON) provided thereon may be used as the gate insulating film as shown in FIGS. 5A and 5B, in which case the thickness of the multi-layered film is adjusted in accordance with the maximum applied voltages to the functional blocks.

FIGS. 5A and 5B schematically show gate insulating films and gate electrodes in MOSFETs in the CPU section F2 and I/O section F1, respectively.

In the structures shown in FIGS. 5A and 5B, gate insulating films GX5 and GX6 are formed on the semiconductor substrate X1 and the gate electrode X4 is formed on both of the gate insulating films GX5 and GX6.

The gate insulating film GX5 is composed of a silicon oxide film X2 provided on the semiconductor substrate X1 and a silicon oxynitride film X8 provided thereon, and the gate insulating film GX6 is composed of a silicon oxide film X2 provided on the semiconductor substrate X1 and a silicon oxynitride film X9 provided thereon.

The film thickness T2 of the gate insulating film GX6 in the I/O section F1 shown in FIG. 5B is thicker than the film thickness T1 of the gate insulating film GX5 in the CPU section F2 shown in FIG. 5A. While the silicon oxide films X2 have the same thickness, the gate insulating film GX6 is thicker than the gate insulating film GX5 since the silicon oxynitride film X9 is thicker than the silicon oxynitride film X8.

The silicon oxynitride film has a larger relative dielectric constant than the silicon oxide film. Accordingly, as in the structures which use an ON film as the gate insulating film, the capacitance of the gate insulating film becomes larger as the silicon oxynitride film becomes thicker and the increase in the capacitance of the gate insulating film increases the operating speed of the circuit.

<A-1-4. Third Example of Gate Insulating Film Structure for Securing Reliability>

Figure 6A:
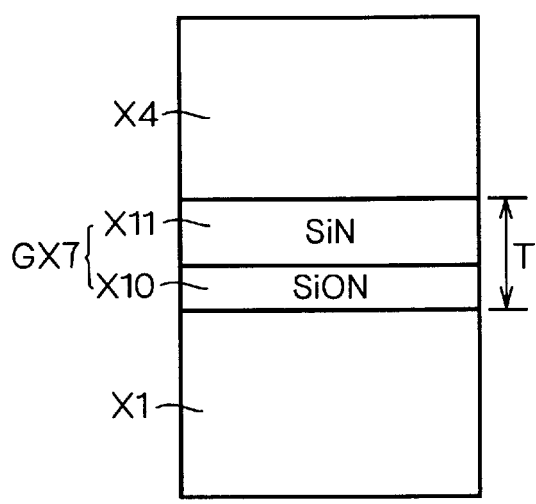
Figure 6B:
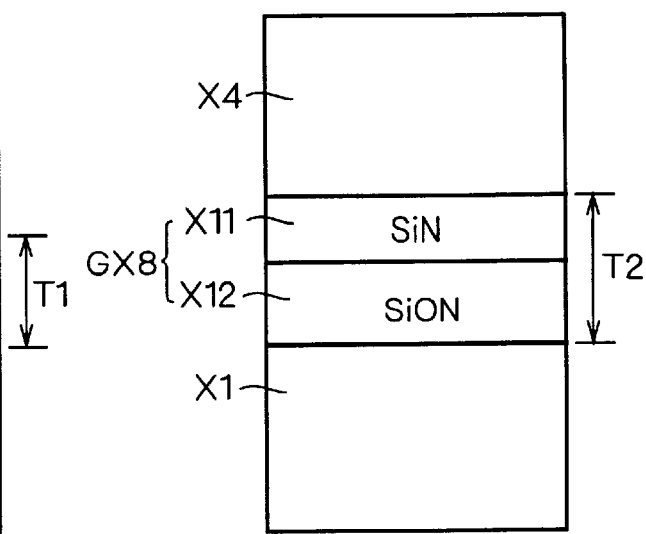

Also, for structure to secure the gate insulating film reliability, a multi-layered film having a silicon oxynitride film (SiON) and a silicon nitride film (SiN) provided thereon may be used as a gate insulating film as shown in FIGS. 6A and 6B, in which case the thickness of the multi-layered film is adjusted in accordance with the maximum applied voltages to the functional blocks.

FIGS. 6A and 6B schematically show gate insulating films and gate electrodes in MOSFETs in the CPU section F2 and I/O section F1, respectively.

In the structures shown in FIGS. 6A and 6B, gate insulating films GX7 and GX8 are formed on the semiconductor substrate X1 and the gate electrode X4 is formed on both of the gate insulating films GX7 and GX8.

The gate insulating film GX7 is composed of a silicon oxynitride film X10 provided on the semiconductor substrate X1 and a silicon nitride film X11 provided thereon, and the gate insulating film GX8 is composed of a silicon oxynitride film X12 provided on the semiconductor substrate X1 and a silicon nitride film X11 provided thereon.

The film thickness T2 of the gate insulating film GX8 in the I/O section F1 shown in FIG. 6B is thicker than the film thickness T1 of the gate insulating film GX7 in the CPU section F2 shown in FIG. 6A. While the silicon nitride films X11 have the same thickness, the gate insulating film GX8 is thicker than the gate insulating film GX7 since the silicon oxynitride film X12 is thicker than the silicon oxynitride film X10.

Since the silicon oxynitride film has almost the same thermal expansion coefficient as silicon, smaller thermal stress is generated than in the ON film during thermal processing. The stress at the substrate interface can thus be reduced to decrease the interface state density and defect density.

The multi-layered film of silicon oxynitride film and silicon nitride film is superior in hot carrier resistance to the ON film. This is because hydrogen diffusion in the film is suppressed when nitrogen exists at higher concentration in the film.

Forming the silicon nitride film thinner than the silicon oxynitride film reduces the stress at the substrate interface to decrease the interface state density and defect density, as stated in the examples in which an ON film is used as the gate insulating film.

The above-described setting of the multi-layered film thickness of silicon oxynitride film and silicon nitride film has been shown just as an example, and other settings are also possible.

Figure 7A:
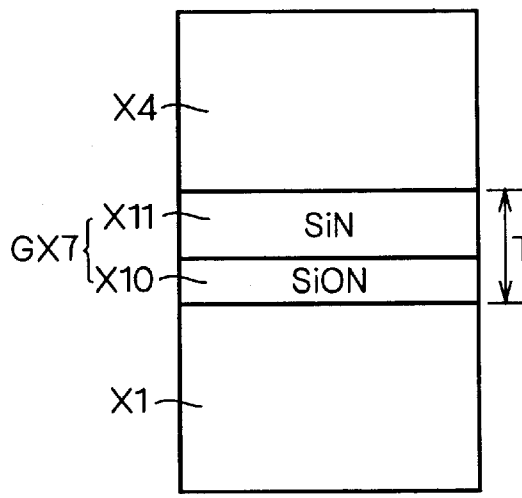
Figure 7B:
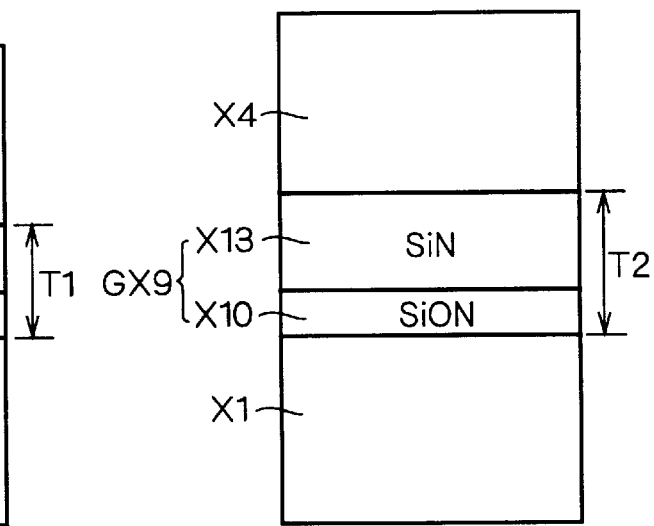

For example, FIGS. 7A and 7B schematically show another example of film thickness setting of the multi-layered film of silicon oxynitride film and silicon nitride film in the CPU section F2 and I/O section F1, respectively.

In FIGS. 7A and 7B, gate insulating films GX7 and GX9 are formed on the semiconductor substrate X1 and the gate electrode X4 is formed on both of the gate insulating films GX7 and GX9.

While the gate insulating film GX7 is the same as that shown in FIG. 6A, the gate insulating film X9 is composed of a silicon oxynitride film X10 provided on the semiconductor substrate X1 and a silicon nitride film X13 provided thereon.

The film thickness T2 of the gate insulating film GX9 in the I/O section F1 shown in FIG. 7B is thicker than the film thickness T1 of the gate insulating film GX7 in the CPU section F2 shown in FIG. 7A. The gate insulating film GX9 is thicker than the gate insulating film GX7 since the silicon nitride film X13 is thicker than the silicon nitride film X11.

<A-2. Functions and Effects>

As described above, a two-layer insulating film is used as a gate insulating film and the film thickness of one of the two layers or the film thicknesses of both layers are adjusted according to the maximum applied voltages to the individual functional blocks; the thickness of the multi-layered film can thus be adjusted to optimize the operating speed and reliability in the individual functional blocks.

<B. Second Preferred Embodiment>

<B-1. Devise Structure>

Figure 8:
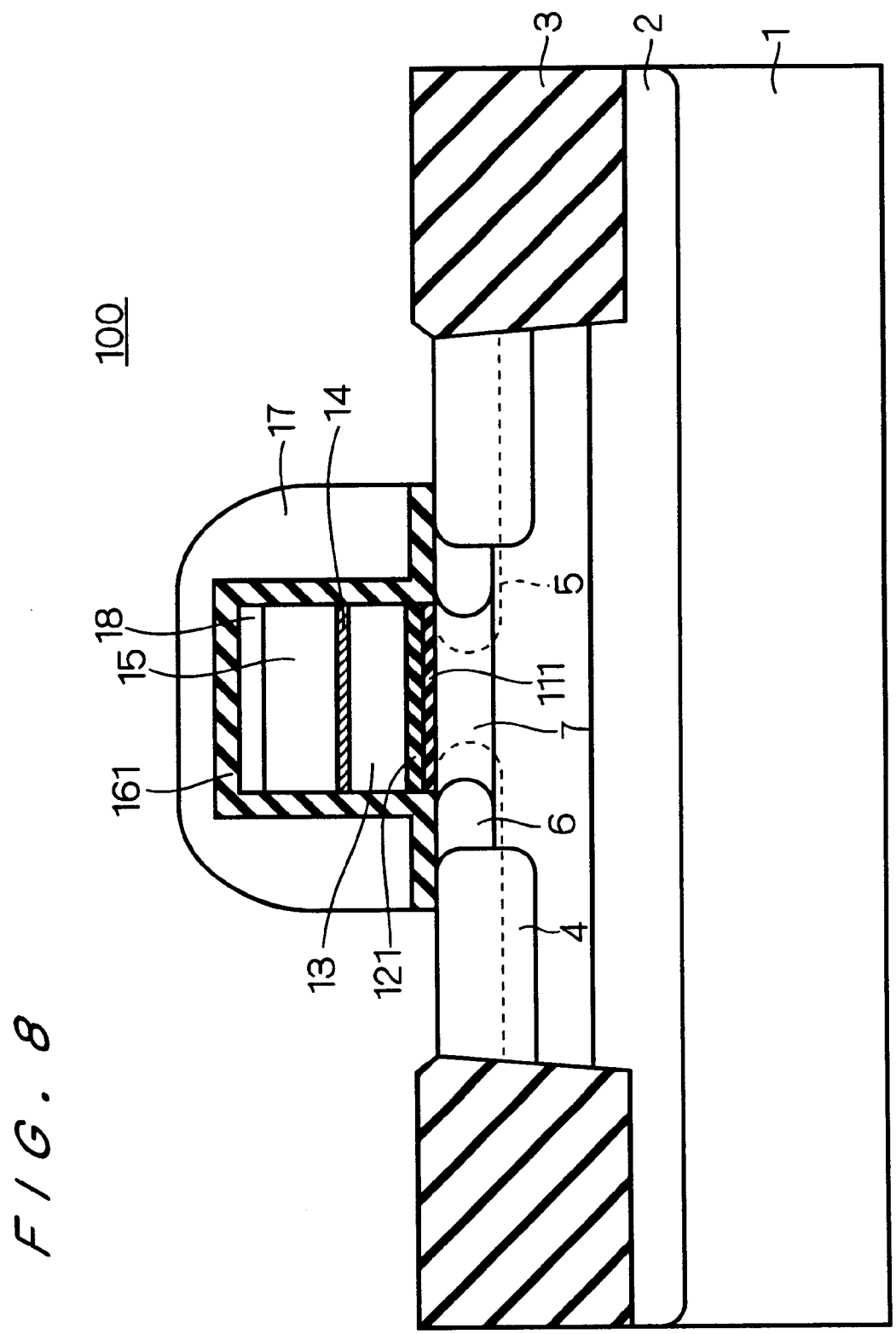
FIG. 8 is a sectional view showing the structure of a MOSFET according to a second preferred embodiment of the present invention.

FIG. 8 shows a sectional structure of a MOSFET 100 according to a second preferred embodiment of the present invention.

In FIG. 8, the MOSFET 100 has a gate insulating film composed of a two-layer film including a silicon oxide film 111 which contains heavy hydrogen and a silicon nitride film 121 which contains heavy hydrogen, which are provided in order on a silicon substrate 1; it also has a gate electrode composed of a three-layer film including a doped polysilicon film 13, a barrier metal (WNx, TiNx, Ta, TaN, etc.) layer 14 and a metal film 15 of tungsten etc., which are provided in order on the silicon nitride film 121. Structure of the gate electrode does not have influence on the invention, so that the gate electrode structure is not limited to the above-described structure and a simple metal electrode (Cu, Mg, Pt, Zr, Mo, W, Al, Ag, Au, Ni, Co, Ti, etc.) can be used as the gate electrode.

A silicon nitride film 18 is provided on the metal film 15 and a coating insulating film 161 covers the gate insulating film, gate electrode and silicon nitride film 18.

It further has a sidewall insulating film 17 covering at least the sides of the coating insulating film 161, a channel layer 7 provided in the surface of the silicon substrate 1 under the gate electrode, a pair of extension layers 6 facing each other through the channel layer 7, and a pair of main source/drain layers 4 adjacent to the pair of extension layers 6, with pocket layers 5 overlapping with the entire extension layers 6, part of the main source/drain layers 4 and part of the channel layer 7.

While the extension layers 6 should be referred to as source/drain extension layers 6 since they have the same conductivity type as the main source/drain layers 4 and function as source/drain layers, they are called extension layers 6 for convenience.

The pocket layers 5 are formed for the purpose of suppressing the short-channel effect, which are formed by implanting an impurity having a different conductivity type from the main source/drain layers 4 (the same conductivity type as the channel layer). Forming the pocket layers 5 protruding over the extension layers 6 reduces the threshold voltage variation caused by variation of the gate length, thus alleviating the roll-off curve.

The active region of the MOSFET 100 is defined by an STI (Shallow Trench Isolation) film 3, a kind of element isolation insulating film, and a channel stopper layer 2 is provided in the silicon substrate 1.

The MOSFET 100 is characterized in that the silicon nitride film 121 and the silicon oxide film 111 forming an ON film as the gate insulating film contain heavy hydrogen. A method for forming the ON film containing heavy hydrogen atoms is now described.

<B-2. Method for Forming ON Film Containing Heavy Hydrogen Atoms>

<B-2-1. Method for Forming Silicon Nitride Film Containing Heavy Hydrogen>

First, a method for forming a silicon nitride film which contains heavy hydrogen (deuterium: D) is described. Chemical reactions used to form the heavy-hydrogen-containing silicon nitride film are expressed by Formulas (3) and (4) below.

$$3SiH_2Cl_2(g)+4ND_3(g) \rightarrow 3Si_3N_4(s)+6HCl(g)+6D_2(g) \quad (3)$$

$$3SiD_4(g)+4N*(g) \rightarrow Si_3N_4(s)+6D_2(g) \quad (4)$$

Formula (3) shows a reaction in an LPCVD (Low Pressure Chemical Vapor Deposition) device or RTA (Rapid Thermal Anneal) device and Formula (4) shows a reaction in a PECVD (Plasma Enhanced Chemical Vapor Deposition) device utilizing plasma excitation reaction. Formulas (5) and (6) shown below are examples of modifications of Formula (3).

$$3SiD_2Cl_2(g)+4NH_3(g) \rightarrow 3Si_3N_4(s)+3DCl(g)+3HCl(g)+3H_2(g) \quad (5)$$

$$3SiD_2Cl_2(g)+4ND_3(g) \rightarrow 3Si_3N_4(s)+6DCl(g)+6D_2(g) \quad (6)$$

While the ratio of hydrogen molecules to heavy hydrogen molecules on the right side of Formula (5) is assumed to be 1:1, this ratio depends on the reaction temperature, partial pressure, etc. and is not uniquely determined.

Figure 9:
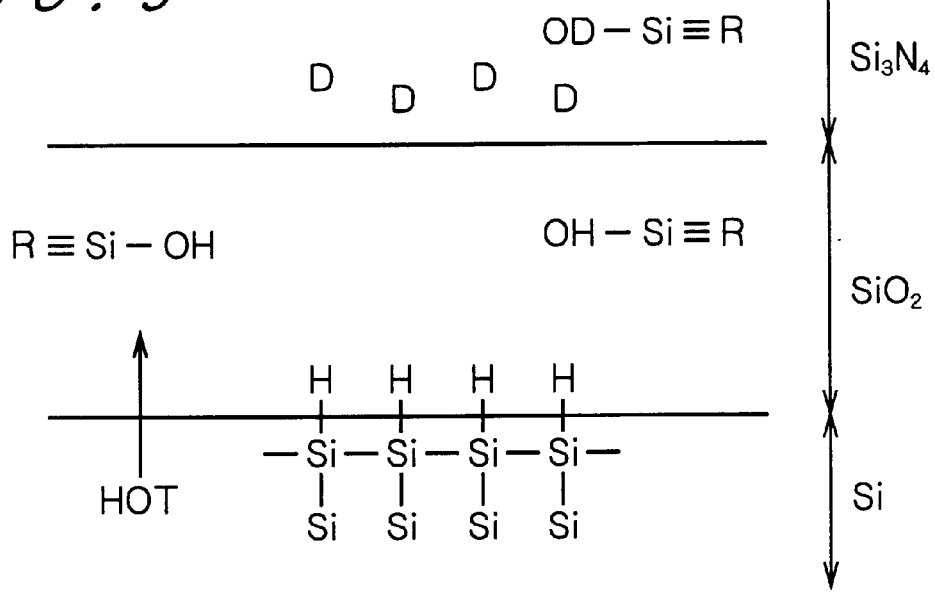
FIGS. 9 to 14 are schematic diagrams used to explain how heavy hydrogen atoms and hydrogen atoms behave in an ON film when a stress voltage is applied.
Figure 10:
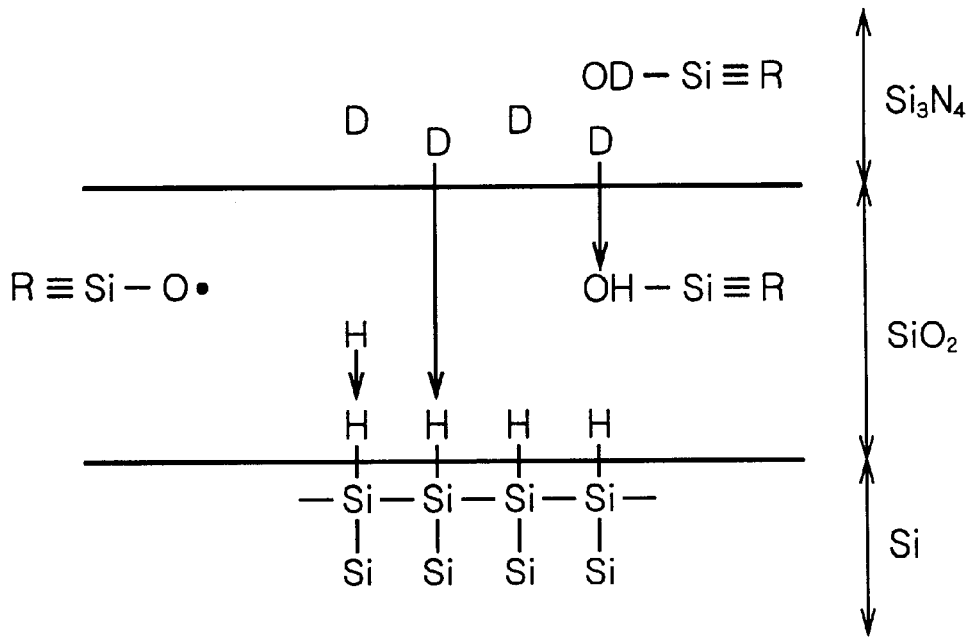
Figure 11:
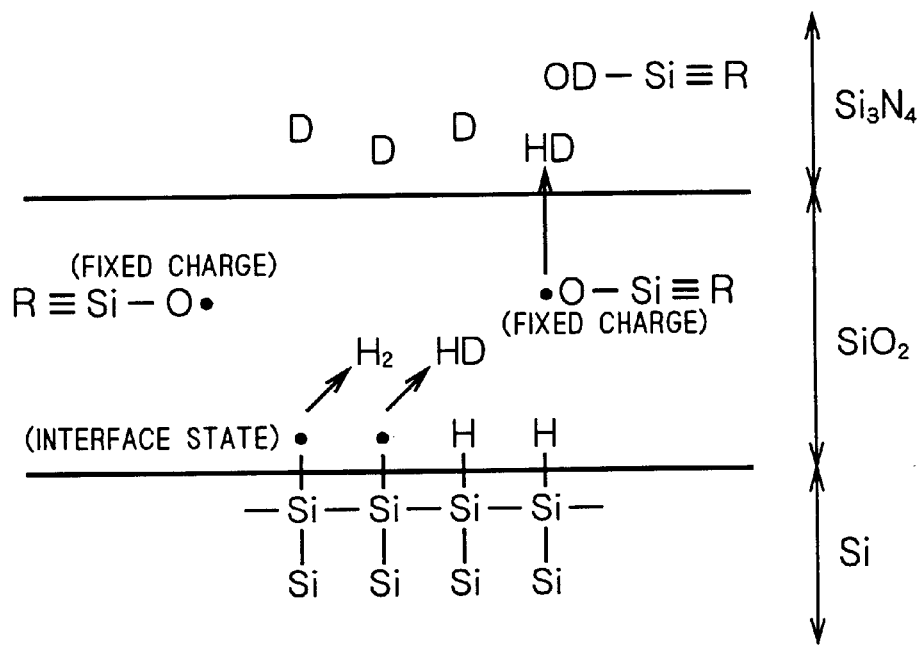

FIGS. 9 to 11 are schematic diagrams used to explain how heavy hydrogen atoms and hydrogen atoms in the ON film behave when a stress voltage is applied. FIGS. 9 to 11 show an example in which a silicon nitride film which contains heavy hydrogen is formed on a silicon oxide film formed by a conventional method.

As shown in FIG. 9, heavy hydrogen atoms introduced in the silicon nitride film are bonded with silicon atoms or exist alone.

As shown in FIG. 9, the silicon oxide film contains hydrogen atoms, which are bonded with part of the silicon atoms. FIG. 9 shows combined structures of a silicon atom (Si) and a hydroxyl group (OH). Three atoms shown by R are bonded to a silicon atom by single bond. This shows that three atoms of oxygen (O), hydrogen (H), silicon, etc. are bonded thereto by single bond. A combined structure of a silicon atom and an OD group is shown in the silicon nitride film, where three atoms shown by R are bonded to the silicon atom by single bond. The same expression is used also in FIGS. 10 to 14.

Dangling bonds of silicon atoms at the silicon oxide film/silicon substrate interface are bonded with and terminated by hydrogen atoms introduced during the process of hydrogen sintering etc.

While a so-called hydrogen atom is H ($^1$H protium: mass number 1), the heavy hydrogen includes D ($^2$H deuterium: mass number 2) and T ($^3$H tritium: mass number 3). While D (deuterium) is stable, T (tritium) is a radioactive substance which $\beta^-$ decays with a half-life of 12 years, so it is not desirable for use in semiconductor devices. Therefore the second preferred embodiment uses the heavy hydrogen D having a mass number of 2.

When a stress voltage is applied, hot carriers HOT in the silicon substrate, which have been accelerated by the internal electric field and gained energy larger than the barrier energy at the silicon oxide film/silicon substrate interface, pass through the interface into $SiO_2$ as shown in FIG. 9.

Because of the energy of the hot carriers HOT, bonds of hydrogen atoms of hydroxyl groups bonded to silicon atoms are cut and the dangling bonds of oxygen atoms function as fixed charges.

As shown in FIG. 10, hydrogen atoms freed from the bonds and heavy hydrogen atoms in the silicon nitride film reach the silicon oxide film/silicon substrate interface because of drift caused by the electric field in the gate insulating film or because of thermal diffusion. The hydrogen atoms and deuterium atoms which have arrived at the interface react with the combined structure of Si atoms and hydrogen atoms at the interface to form hydrogen molecules and hydrogen-deuterium molecules.

Deuterium atoms may react with hydrogen atoms of the hydroxyl groups bonded to silicon atoms to form hydrogen-deuterium molecules (HD).

These hydrogen molecules ($H_2$) and hydrogen-deuterium molecules volatilize as gas, and as shown in FIG. 11, the dangling bonds of silicon atoms at the silicon oxide film/silicon substrate interface function as interface states and the dangling bonds of silicon atoms in the silicon oxide film function as fixed charges.

Formation of the fixed charges and interface states causes threshold voltage variation, drain current deterioration etc., which reduces the operating speed of the circuit and causes malfunction of the circuit. However, deuterium atoms, which have a larger atomic weight than hydrogen atoms, drift or thermally diffuse slowly. Therefore the deuterium atoms in the silicon nitride film take longer time to reach the silicon oxide film/silicon substrate interface than hydrogen atoms in the silicon nitride film. As a result, the hot carrier resistance under stress voltage is improved to lengthen the life of the MOSFET.

<B-2-2. Method for Forming Silicon Oxide Film Containing Deuterium>

A method for forming a silicon oxide film which contains deuterium is now described. The deuterium-containing silicon oxide film is formed with water which contains deuterium ($D_2O$). This chemical reaction is expressed by Formula (7) below.

$$Si(s)+2D_2O(g) \rightarrow SiO_2(s)+2D_2(g) \quad (7)$$

For a specific method, $D_2O$ (deuterium oxide) is heated to produce gas and the gas is passed in a reaction oven made of a quartz tube; the gas reacts as shown by Formula (7) to oxidize a silicon substrate. Alternatively, a silicon oxide film or ON film formed by a conventional method may be heat-treated in a deuterium atmosphere so that deuterium is introduced therein.

Figure 12:
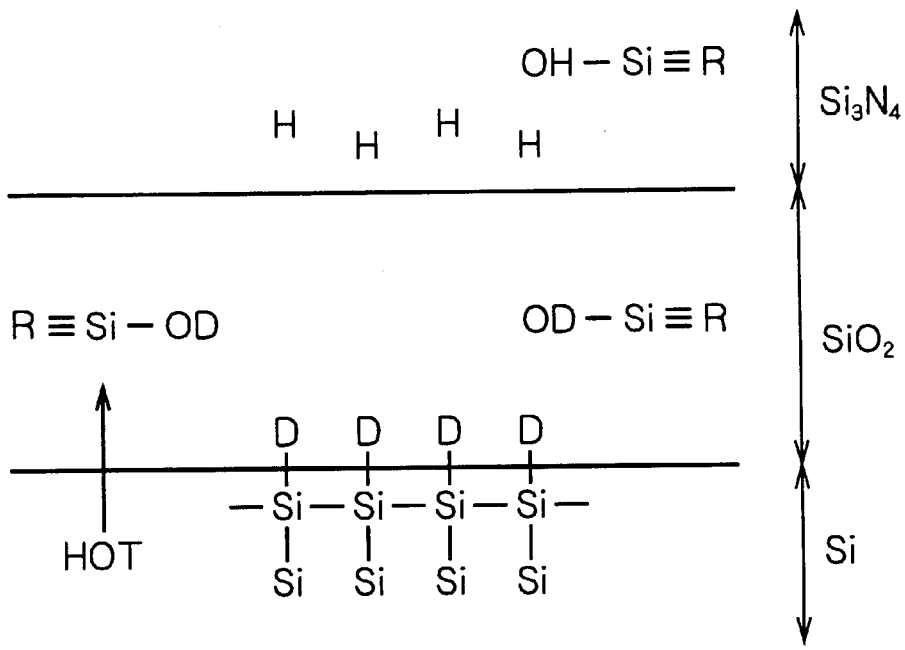
Figure 13:
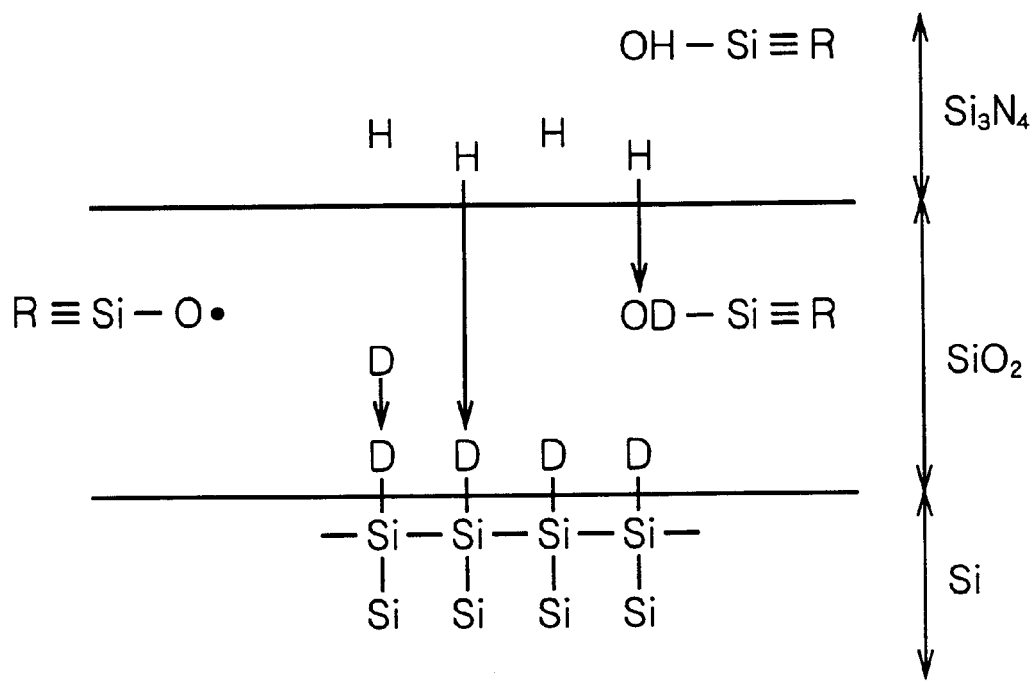
Figure 14:
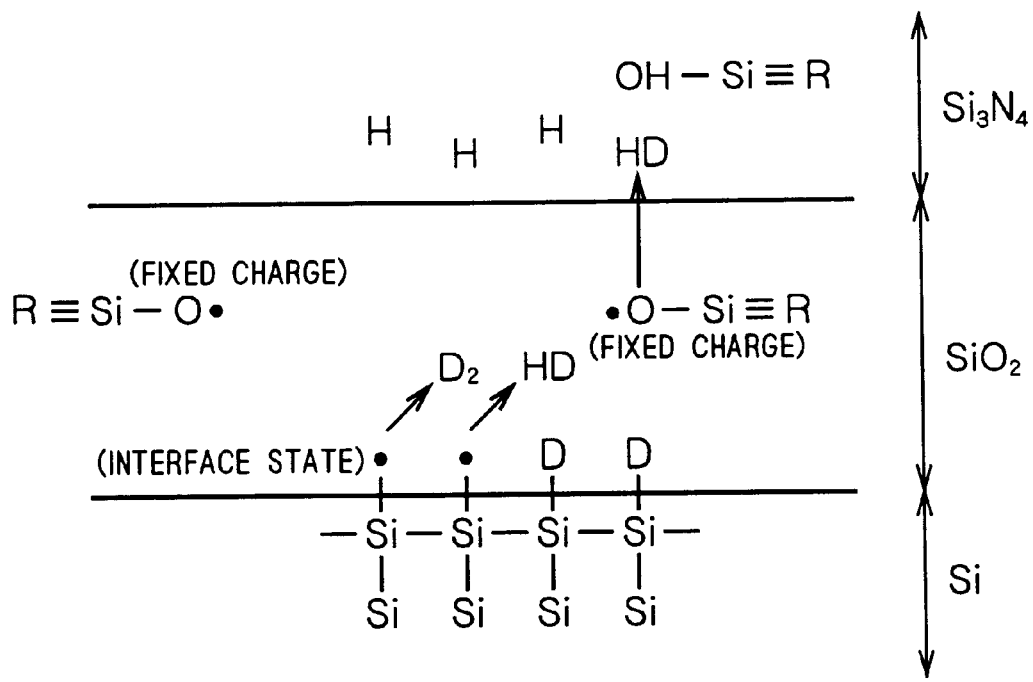

FIGS. 12 to 14 are schematic diagrams used to explain how deuterium atoms and hydrogen atoms behave in an ON film when a stress voltage is applied. FIGS. 12 to 14 show an example in which a silicon nitride film is formed by a conventional method on a silicon oxide film which contains deuterium.

As shown in FIG. 12, deuterium atoms introduced in the silicon oxide film are combined with oxygen atoms bonded to silicon atoms and terminate the dangling bonds, which reduces the trap (trap center) density. Or they may join and terminate dangling bonds of silicon atoms at the silicon oxide film/silicon substrate interface, which reduces the interface state density.

When a stress voltage is applied, hot carriers HOT in the silicon substrate, which have been accelerated by the internal electric field and gained energy larger than the barrier energy at the silicon oxide film/silicon substrate interface, pass through the interface into the silicon oxide as shown in FIG. 12.

Because of the energy of the hot carriers HOT, the bonds of deuterium atoms of OD groups bonded to silicon atoms are cut and the dangling bonds of oxygen atoms function as fixed charges. However, since the bond energy between deuterium atoms and oxygen atoms is larger than that between hydrogen atoms and oxygen atoms, the deuterium atoms are less susceptible to dissociation from oxygen atoms caused by hot carriers.

As shown in FIG. 13, the deuterium atoms freed from the bonds and hydrogen atoms in the silicon nitride film reach the silicon oxide film/silicon substrate interface because of drift caused by the electric field in the gate insulating film or because of thermal diffusion. The hydrogen atoms and deuterium atoms which have arrived at the interface react with the combined structure of silicon atoms and hydrogen atoms at the interface to form deuterium molecules and hydrogen-deuterium molecules.

The deuterium atoms may react with hydrogen atoms of the hydroxyl groups bonded to silicon atoms to form hydrogen-deuterium molecules.

These hydrogen molecules and hydrogen-deuterium molecules volatilize as gas, and as shown in FIG. 14, the dangling bonds of silicon atoms at the silicon oxide film/silicon substrate interface function as interface states and the dangling bonds of silicon atoms in the silicon oxide film function as fixed charges.

The fixed charge and interface state generation causes threshold voltage variation, drain current deterioration etc., which reduce the operating speed of the circuit and cause malfunction of the circuit. However, the dissociation due to hot carriers is less likely to occur since the bond between deuterium atoms and silicon atoms is strong. As a result, the hot carrier resistance under stress voltage is improved to lengthen the lifetime of the MOSFET.

<B-3. MOSFET Manufacturing Method>

Next, a method for manufacturing the MOSFET 100 is described referring to FIGS. 15 to 19 which show the manufacturing process steps in order.

Figure 15:
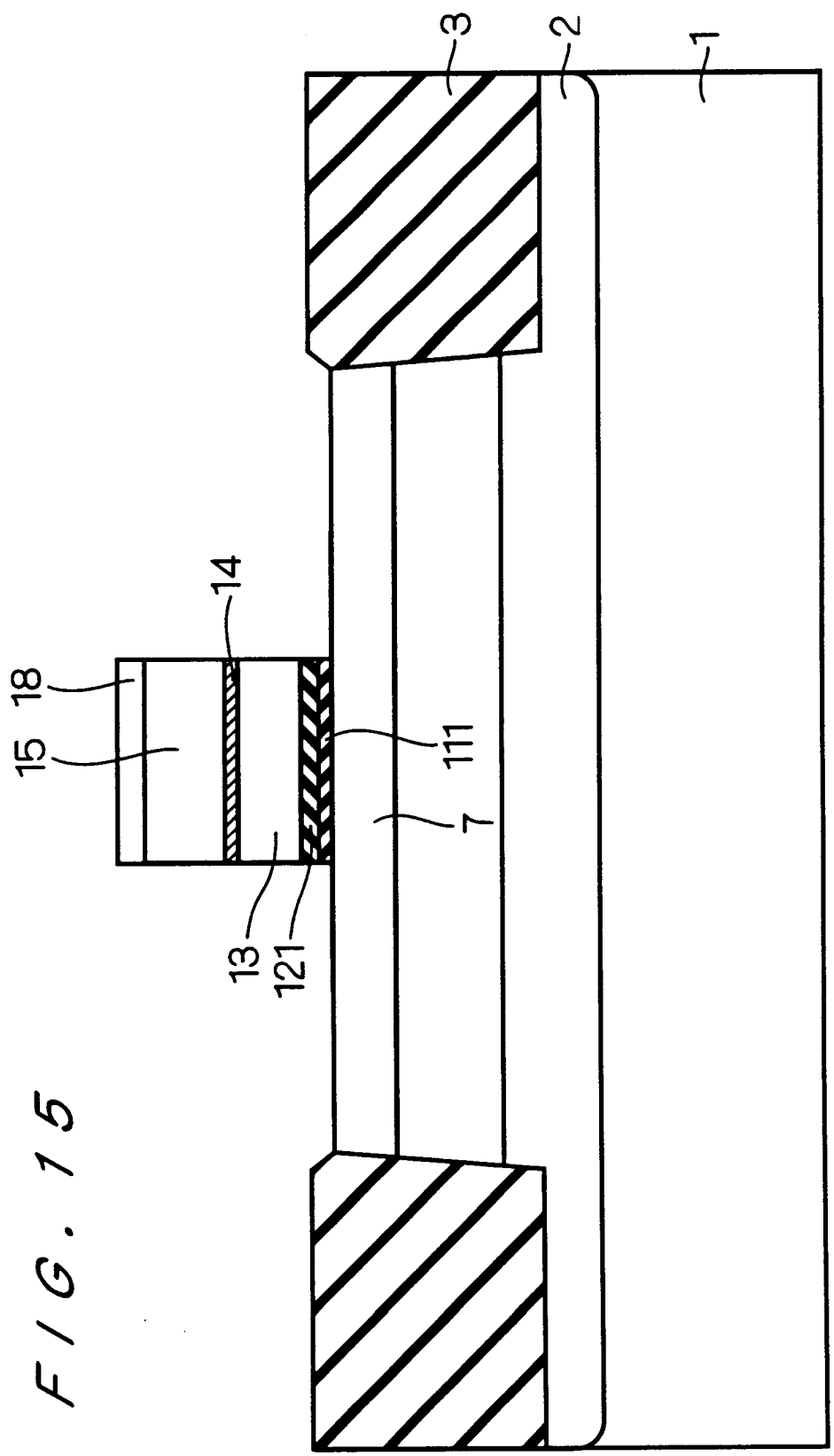
FIGS. 15 to 19 are sectional views used to explain a process of manufacturing the MOSFET of the second preferred embodiment.

First, as shown in FIG. 15, the silicon substrate 1 is prepared and the active region is defined by the STI film 3. Then the channel layer 7 and the channel stopper layer 2 are formed by ion implantation.

For the channel layer 7, boron, boron difluoride (BF$_2$), indium (In), etc. are implanted in N-type MOSFETs and phosphorus (P), arsenic (As), antimony (Sb), etc. are implanted in P-type MOSFETs.

For the channel stopper layer 2, the same impurity as that implanted into the channel layer 7 is implanted at higher implant energy.

Then the multilayer film including the deuterium-containing silicon oxide film 111, deuterium-containing silicon nitride film 121, doped polysilicon film 13, barrier metal layer 14, metal film 15 and silicon nitride film 18 is selectively formed on the active region.

In formation of the silicon oxide film 111 and silicon nitride film 121, the methods explained using Formulas (3) to (7) can be adopted and, of course, the film thickness of at least one of the silicon oxide film 111 and silicon nitride film 121 is adjusted in correspondence with the maximum applied voltages to the individual functional blocks in the semiconductor device.

For the doped polysilicon film 13, a dopant such as boron, phosphorus, nitrogen, etc. is introduced by ion implantation. In this process, when the dose is at least $1 \times 10^{15}/cm^2$ or higher, the polysilicon layer degenerates to present electric conduction like that of a metal.

The barrier metal layer 14 is provided to prevent constitutive atoms of the metal film 15 from diffusing into adjacent film. In this sense, this can be formed also on top of the metal film 15.

The silicon nitride film 18 is deposited by PECVD; this film functions as an ARC (Anti Reflection Coating) film for preventing halation so that the length of the resist mask will not become shorter than the layout gate length because of light reflected from the underlying film in the exposure process for gate patterning. FIG. 15 shows the structure obtained after the gate patterning.

Figure 16:
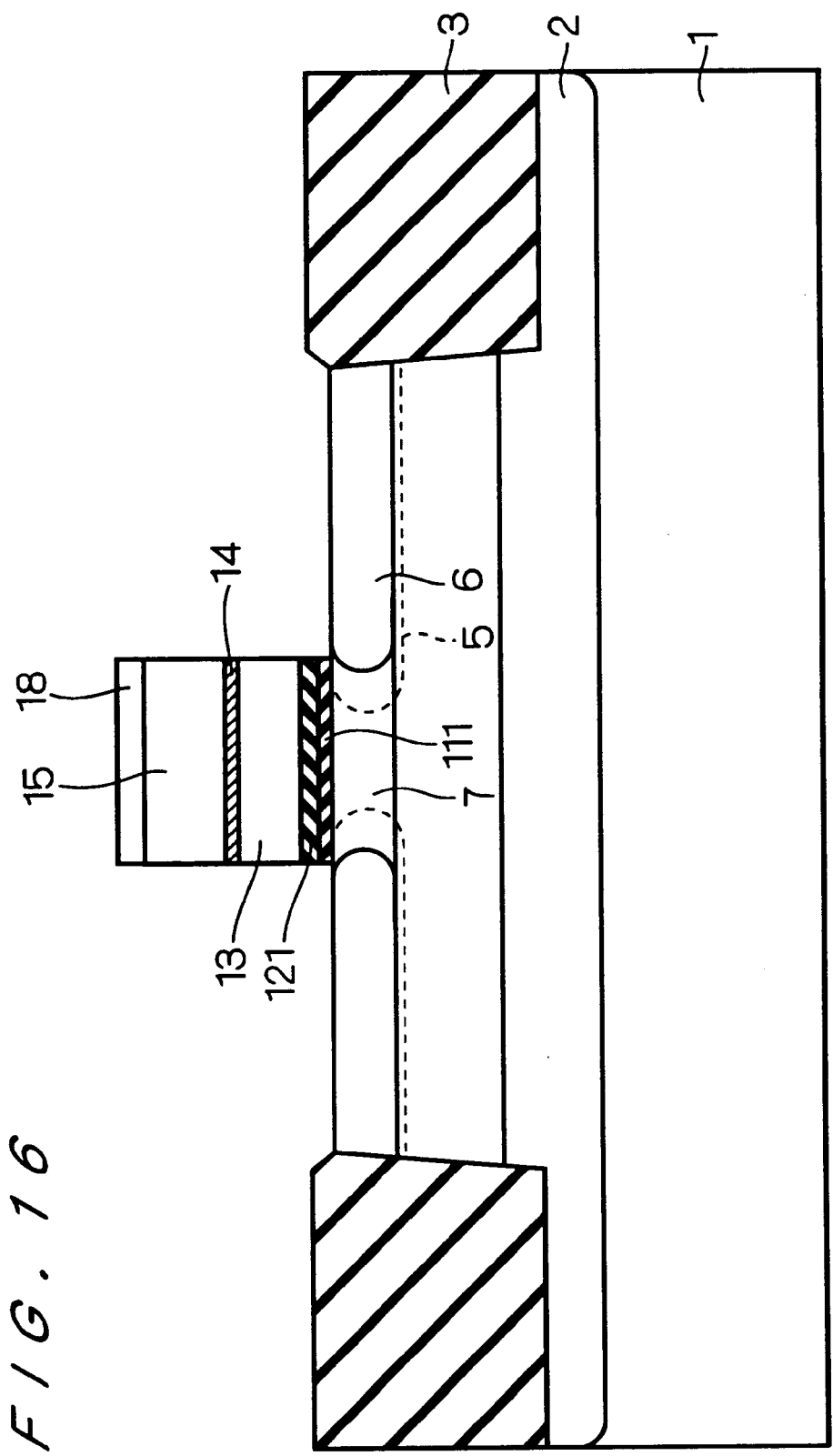

Next, in the process shown in FIG. 16, ion implantation is applied from above the patterned gate electrode to form the pocket layers 5 and extension layers 6 in the surface of the silicon substrate 1 in a self-aligned manner.

For the extension layers 6, P, As, Sb, nitrogen (N), etc. are implanted in N-type MOSFETs and B, BF$_2$, In, etc. are implanted in P-type MOSFETs.

For the pocket layers 5, B, BF$_2$, In, etc. are implanted in N-type MOSFETs and P, As, Sb, N, etc. are implanted in P-type MOSFETs.

In formation of the pocket layers 5, the implantation may be obliquely applied with the substrate inclined so that the pocket layers 5 extend over the ends of the extension layers 6.

Figure 17:
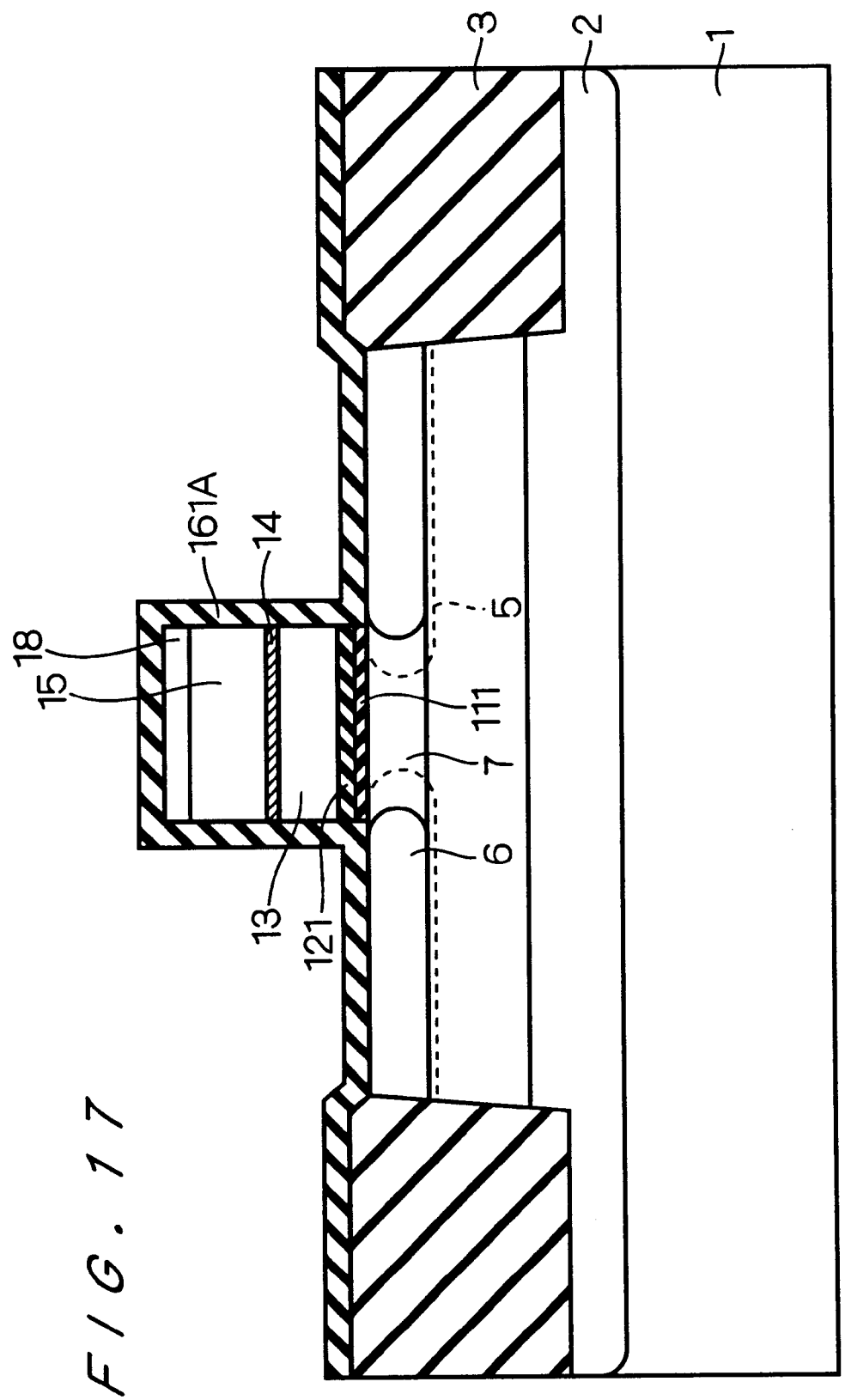

Next, in the process shown in FIG. 17, the entire silicon substrate 1 is processed by RTA in an atmosphere of nitrogen or nitric oxide (NO). The gate electrode, silicon nitride film 18 and the exposed surface of the silicon substrate 1 thus undergo nitridation or oxynitridation to form a coating insulating film 161A. In this process, a silicon nitride film or silicon oxynitride film (both are oxidation-resistant film) is formed on the sides of the doped polysilicon film 13 and a metal nitride film is formed on the sides of the metal film 15.

Figure 18:
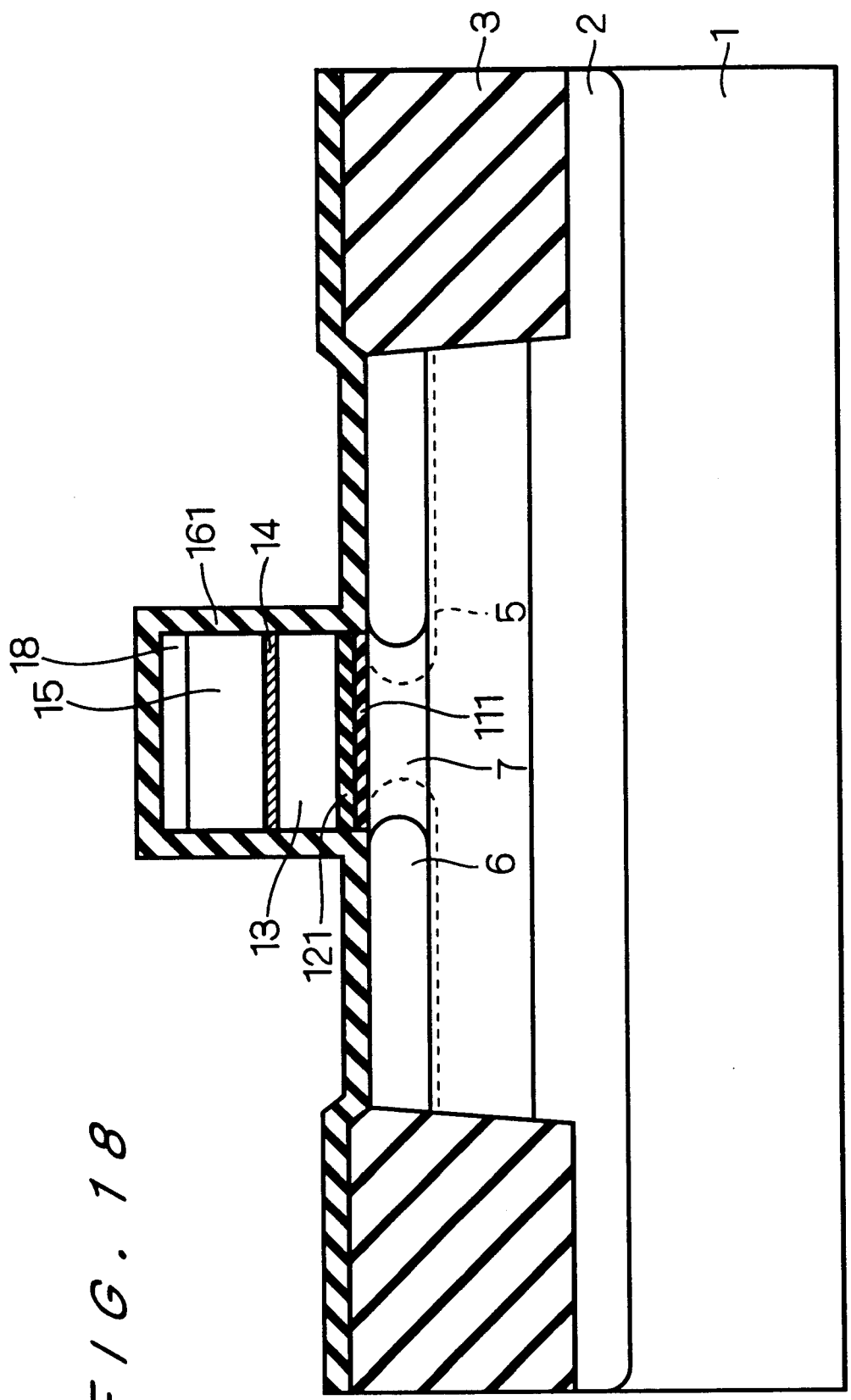

Next, in the process shown in FIG. 18, the entire silicon substrate 1 is processed by RTO (Rapid Thermal Oxidation) to oxidize the coating insulating film 161A to form the coating insulating film 161. Oxidation is done so that defects formed in the gate electrode or silicon substrate by anisotropic etching or ion implantation will be taken in the oxide film and removed.

The doped polysilicon film 13 is not largely oxidized since the oxidation-resistant film resides on the sides thereof.

A silicon oxynitride film is formed on the exposed surface of the silicon substrate 1 by the RTA process and RTO process and at the same time the dopants ion-implanted in the extension layers 6 and pocket layers 5 are coordinated in crystal lattice locations forming the silicon substrate and become active.

Figure 19:
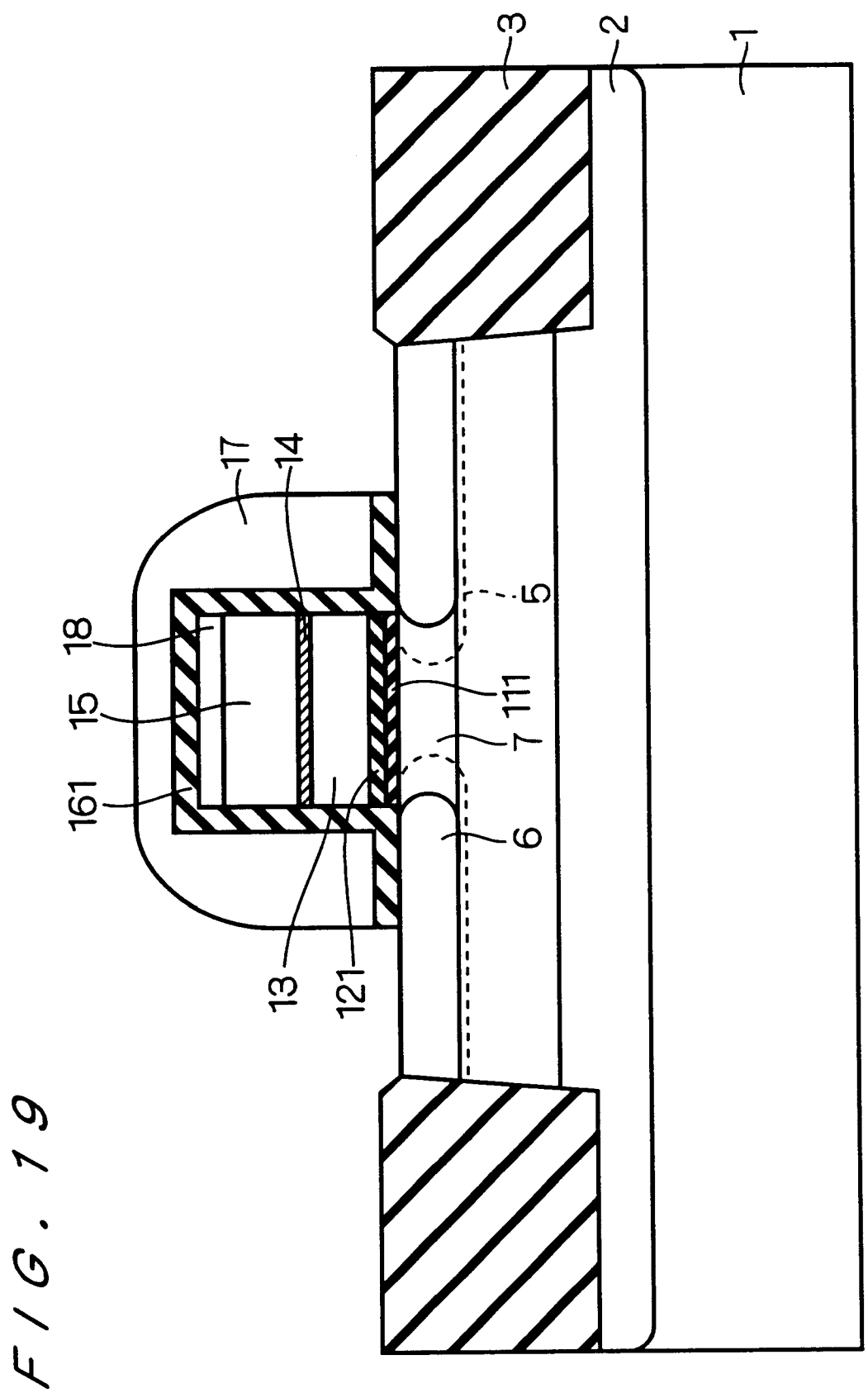

Next, in the process shown in FIG. 19, an insulating film is formed to cover the entire surface and the sidewall insulating film 17 is formed by anisotropic etching to cover at least the sides of the coating insulating film 161. For the insulating film, a silicon nitride film, silicon oxynitride film, silicon oxide film, TEOS (Tetraethyl Orthosilicate: Si(OC$_2$H$_5$)$_4$) film, BPTEOS (Boro-Phospho Tetraethyl Orthosilicate) film, or a multilayer film thereof can be used.

Finally, ion implantation is applied from above the sidewall insulating film 17 to form the main source/drain layers 4 in the surface of the silicon substrate 1 in a self-aligned manner, thus completing the MOSFET 100 shown in FIG. 8.

For the main source/drain layers 4, P, As, Sb, N, etc. are implanted in N-type MOSFETs and B, BF$_2$, In, etc. are implanted in P-type MOSFETs.

After this, the structure may be processed by: ion-implanting nitrogen, germanium or argon into the surface of the main source/drain layers 4 to form amorphous silicon in the surface of the main source/drain layers 4, forming a refractory metal film of cobalt, titanium, etc. on the entire surface, and applying high temperature treatment to cause silicidation to form metal silicide in the area where the exposed surface of the silicon substrate 1 and the refractory metal film are in contact. Formation of the metal silicide reduces the resistance of the main source/drain layers 4 to enhance operating speed of the MOSFET 100.

<B-4. Functions and Effects>

As described above, deuterium atoms are heavier than hydrogen atoms, so that they drift or diffuse slower than hydrogen atoms from the silicon nitride film to the silicon oxide/silicon substrate interface. Accordingly, the presence of deuterium in the silicon nitride film of ON film slows down interface state generation even when a stress voltage is applied. The reliability of MOSFETs can thus be enhanced.

Furthermore, the bond energy between deuterium atoms and silicon atoms is larger than that between hydrogen atoms and silicon atoms, so that deuterium atoms are less susceptible to the hot-carrier-induced dissociation from silicon atoms. Hence, the presence of deuterium in the silicon oxide film of ON film suppresses hot-carrier-induced dissociation under stress voltage, thus improving the hot carrier resistance under stress voltage. This lengthens the lifetime of MOSFETs and improves the reliability.

While an ON film structure in which only the silicon nitride film or only the silicon oxide film contains deuterium provides the effect of improving the reliability of MOSFETs as explained above, an ON film in which both films contain deuterium like that of the MOSFET 100 shown in FIG. 8 provides an improved effect.

<B-5. Modifications>

While the second preferred embodiment has shown a structure in which an ON film containing deuterium is used as a gate insulating film, a silicon oxynitride film (SiON) may be used in place of the silicon oxide film in the ON film.

Chemical reactions used to form a silicon oxynitride film which contains deuterium are expressed by Formulas (8) to (11) below.

$$2ND_3(g)+2Si(s)+O_2(g)\rightarrow 2SiON(s)+3D_2(g) \quad (8)$$

$$2ND_3(g)+2Si(s)+2D_2O(g)\rightarrow 2SiON(s)+5D_2(g) \quad (9)$$

$$2NH_3(g)+2Si(s)+2D_2O(g)\rightarrow 2SiON(s)+2D_2(g)+3H_2(g) \quad (10)$$

$$2ND_3(g)+2Si(s)+2H_2O(g)\rightarrow 2SiON(s)+3D_2(g)+2H_2(g) \quad (11)$$

It can be formed by passing a gas produced by heating and vaporizing $D_2O$ or vaporized $ND_3$ in a reaction oven made of a quartz tube to oxidize a silicon substrate.

Silicon oxynitride film is superior to silicon oxide film in that nitrogen atoms terminate dangling bonds of silicon atoms in the film. Since the Si—N bond energy is larger than the Si—H bond energy, the bonds are less likely to be broken by hot carriers. Further, nitrogen atoms in the film slow down the drift or thermal diffusion of hydrogen atoms, thus enhancing the hot carrier resistance.

As a conventional method for forming silicon oxynitride film, a gas obtained by diluting NO or $N_2O$ gas with oxygen gas is passed in a reaction furnace made of a quarts tube to oxidize a silicon substrate.

Further, a multi-layered layer in which a silicon oxynitride film which contains deuterium is formed on a silicon oxide film which contains deuterium may be used in place of the ON film which contains deuterium.

<C. Third Preferred Embodiment>

<C-1. Device Structure>

A third preferred embodiment of the present invention is now described, where a coating insulating film which contains deuterium is used to cover the gate insulating film, gate electrode and silicon nitride film thereon.

Figure 20:
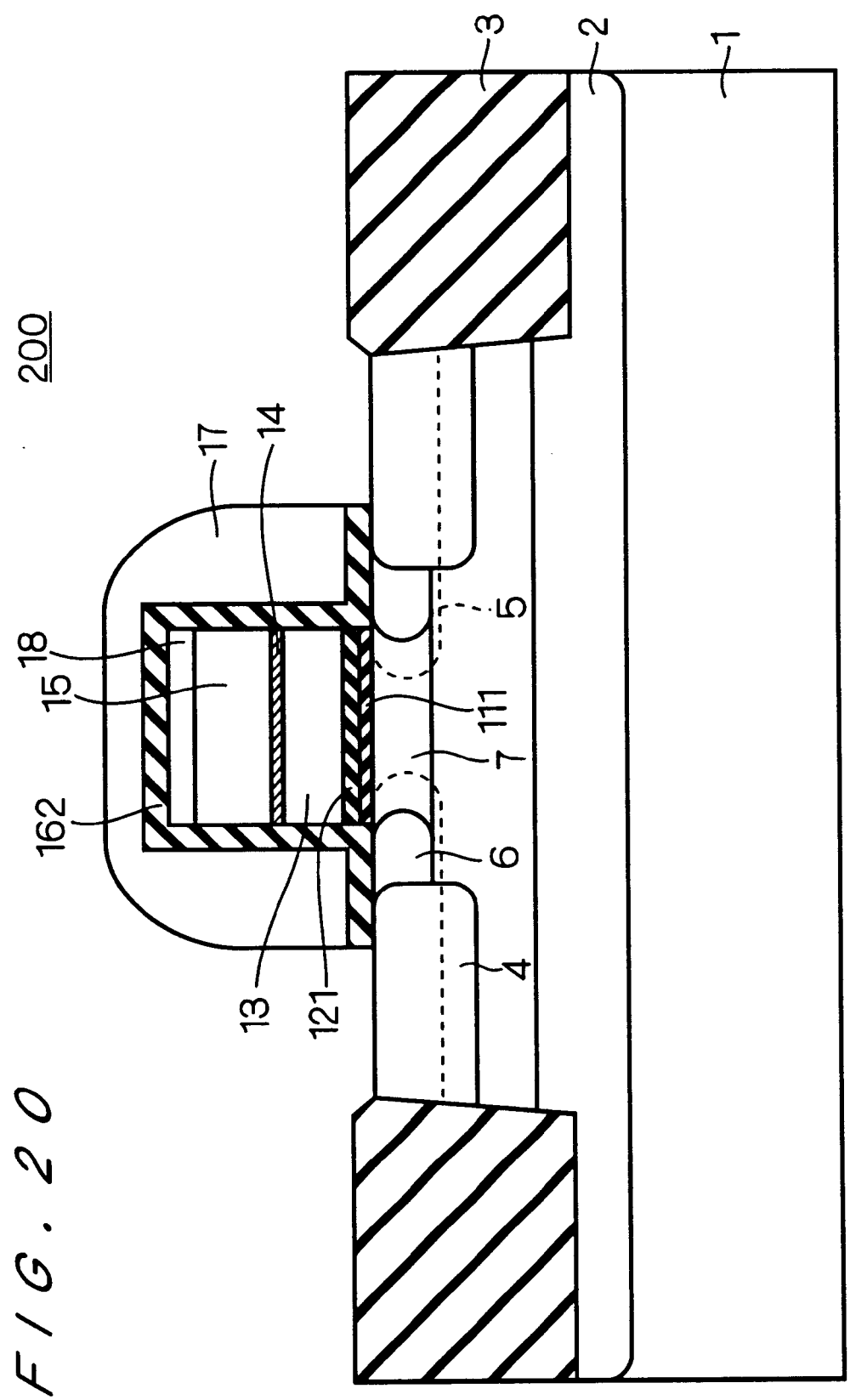
FIG. 20 is a sectional view showing the structure of a MOSFET according to a third preferred embodiment of the invention.

FIG. 20 shows the structure of a MOSFET 200 having a coating insulating film 162 which contains deuterium. In FIG. 20, the same components as those of the MOSFET 100 explained referring to FIG. 8 are shown by the same reference characters and are not described again here.

As shown in FIG. 20, the MOSFET 200 has a gate insulating film composed of a two-layer film including the silicon oxide film 111 which contains deuterium and the silicon nitride film 121 which contains deuterium, a gate electrode composed of a three-layer film including the doped polysilicon film 13, barrier metal layer 14 and metal film 15 provided in order on the silicon nitride film 121, and a coating insulating film 162 which contains deuterium and coats the silicon nitride film 18 provided on the gate electrode.

<C-2. Manufacturing Method>

A method for manufacturing the MOSFET 200 is now described. The method is basically the same as the manufacturing method of the MOSFET 100 explained referring to FIGS. 15 to 19. Only the process for forming the coating insulating film 162 is now described because the only difference lies in the formation of the coating insulating film 162.

After formation of the pocket layers 5 and extension layers 6 explained referring to FIG. 16, the coating insulating film 162 is formed over the entirety of the silicon substrate 1, like the coating insulating film 161A shown in FIG. 17.

The main object of formation of the coating insulating film 162 is to repair etching damage formed in the silicon substrate surface in the process of anisotropic etching.

Methods for forming the coating insulating film 162 include the two methods: (A) deposition of a silicon oxide film, TEOS oxide film (Tetraethyl Orthosilicate: $Si(OC_2H_5)_4$) or HDP (High Density Plasma) oxide film by CVD, and (B) formation of an oxide film by thermal treatment in an oxidation atmosphere. The two methods are now described.

<C-2-1. Silicon Oxide Film Formation by CVD>

<Silicon Oxide Film Formation by LPCVD>

A chemical reaction used to form the silicon oxide film using CVD is shown by Formula (12) below.

$$SiCl_2D_2(g)+2N_2O(g)\rightarrow SiO_2(s)+\text{by-products}(g) \quad (12)$$

This reaction is characterized in that the silicon oxide film is formed with an LPCVD device by using $SiCl_2D_2$ as source gas, in place of $SiCl_2H_2$ (DCS: dichlorosilane). Thus, part of deuterium atoms contained in $SiCl_2D_2$ are taken into the silicon oxide film during the reaction. Organosilicon compounds etc. are formed as well as silicon oxide film during the reaction, which are shown as by-products. This applies also to other reaction formulas shown below.

For a method for forming $SiCl_2D_2$, it can be formed by utilizing the chemical reaction expressed by Formula (13) below.

$$Si(s)+2DCl(g)\rightarrow SiCl_2D_2 \quad (13)$$

<TEOS Oxide Film Formation by LPCVD>

A chemical reaction used to form the silicon oxide film using CVD is shown by Formula (14) below.

$$Si(OC_2D_5)_4(l)\rightarrow SiO_2(s)+\text{by-products}(g) \quad (14)$$

This reaction is characterized in that the silicon oxide film is formed with an LPCVD device by using, as source gas, deuterium TEOS in which hydrogen in TEOS has been replaced by deuterium. Thus, part of deuterium atoms contained in the deuterium TEOS are taken into the silicon oxide film during the reaction.

For an example of a method for forming the deuterium TEOS, it can be formed by utilizing the chemical reaction expressed by Formula (15) below.

$$SiCl_4(g)+4C_2D_5OD(g) \rightarrow Si(OCD_5)_4(l)+4DCl(g) \quad (15)$$

<HDP Oxide Film Formation by PECVD>

A chemical reaction used to form HDP silicon oxide film using CVD is expressed by Formula (16) below.

$$Si(OC_2D_5)_4(l)+O_2(g) \rightarrow SiO_2(s)+\text{by-products }(g) \quad (16)$$

This reaction is characterized in that the silicon oxide film is formed with a PECVD device by using, as a source gas, deuterium TEOS in which hydrogen in TEOS has been replaced by deuterium.

In the PECVD method, a voltage (high-frequency voltage) is applied between electrodes under low pressure in a reaction chamber to generate plasma so as to facilitate the CVD reaction with the plasma. The presence of plasma causes TEOS to directly react with oxygen to form high-density silicon oxide film.

The HDP silicon oxide film can be formed also by using the reactions expressed by Formulas (17) and (18) shown below.

$$SiD_4(g)+2N_2O(g) \rightarrow SiO_2(s)+2D_2+2N_2 \quad (17)$$

$$SiD_4(g)+O_2(g) \rightarrow SiO_2(s)+2D_2 \quad (18)$$

These reactions are characterized in that silicon oxide film is formed with a PECVD device by using, as source gas, deuterium silane ($SiD_4$) in which hydrogen in $SiH_4$ (silane) has been replaced by deuterium. Part of deuterium atoms contained in the deuterium silane are taken into the silicon oxide film during the reaction.

<C-2-2. Silicon Oxide Film Formation by Thermal Oxidation>

First, the entire silicon substrate 1 is processed by RTA in an atmosphere of nitrogen to somewhat repair the etching damage caused by anisotropic etching during formation of the gate electrode. During this process, the exposed surface of the silicon substrate 1 and sides of the gate electrode also undergo nitridation.

Since the doped polysilicon film 13 of the gate electrode is easily oxidized, nitridation is applied to its side surface to suppress oxidation. Next, it is thermally treated in an atmosphere of oxidation, for example, to oxidize the exposed surface of the silicon substrate 1 to form a silicon oxide film. In this process, the etching damage is taken into the silicon oxide film and removed. Since the oxidation is applied to the silicon substrate 1 whose surface underwent nitridation in the prior process, the silicon oxide film contains nitrogen atoms.

The oxidation atmosphere may be a $D_2O$ atmosphere, for example. The oxidation reaction in this case is expressed by Formula (19) below.

$$Si(s)+2D_2O(g) \rightarrow SiO_2(s)+2D_2(g) \quad (19)$$

A silicon oxynitride film which contains deuterium atoms may be formed instead of the silicon oxide film. In this case, it can be formed by utilizing the reactions shown by Formulas (8) to (11).

Needless to say, a gate insulating film composed of a two-layer film of deuterium-containing silicon oxide film and deuterium-containing silicon oxynitride film or a gate insulating film composed of a two-layer film of deuterium-containing silicon oxynitride film and deuterium-containing silicon nitride film, as explained in the first preferred embodiment, may be used in place of the gate insulating film composed of the two-layer film of deuterium-containing silicon oxide film 111 and deuterium-containing silicon nitride film 121.

The formation of the silicon nitride film may be achieved by using the chemical reactions expressed by Formulas (20) and (21) shown below, instead of Formulas (1) and (2).

$$3SiO_2(s)+4N^*(g) \rightarrow Si_3N_4(s)+3O_2(g) \quad (20)$$

$$2SiO_2(s)+2N^*(g) \rightarrow 2SiON(s) \quad (21)$$

In the method shown by Formula (20), a silicon oxide film is formed on the surface of a semiconductor substrate and nitridation with nitrogen atom radicals (N*) is applied to the surface of the silicon oxide film, so as to form an ON film made of a two-layer film of $Si_3N_4/SiO_2$. With Formula (21), a two-layer film of $SiON/SiO_2$ is formed.

<C-3. Functions and Effects>

In any of the silicon oxide films containing deuterium formed by the above-described methods, deuterium atoms in the film join and terminate dangling bonds of silicon atoms in the film or join and terminate dangling bonds of silicon atoms at the silicon oxide film/silicon substrate interface, which results in reduction of trap density and interface state density.

The use of the deuterium-containing silicon oxide film, which can reduce dangling bonds, is desirable in that it does not affect the gate insulating film, since the coating insulating film 162 is partially adjacent to the gate insulating film.

<C-4. Modifications>

In the MOSFETs 100 and 200 shown in FIG. 8 and FIG. 20, the gate insulating film, i.e., the deuterium-containing silicon oxide film 111 and deuterium-containing silicon nitride film 121, is in the form patterned in correspondence with the patterned shape of the gate electrode and the coating insulating films 161 and 162 are in contact with the sides of the gate insulating film. However, the structure can be formed as shown in the MOSFET 300 of FIG. 21.

Figure 21:
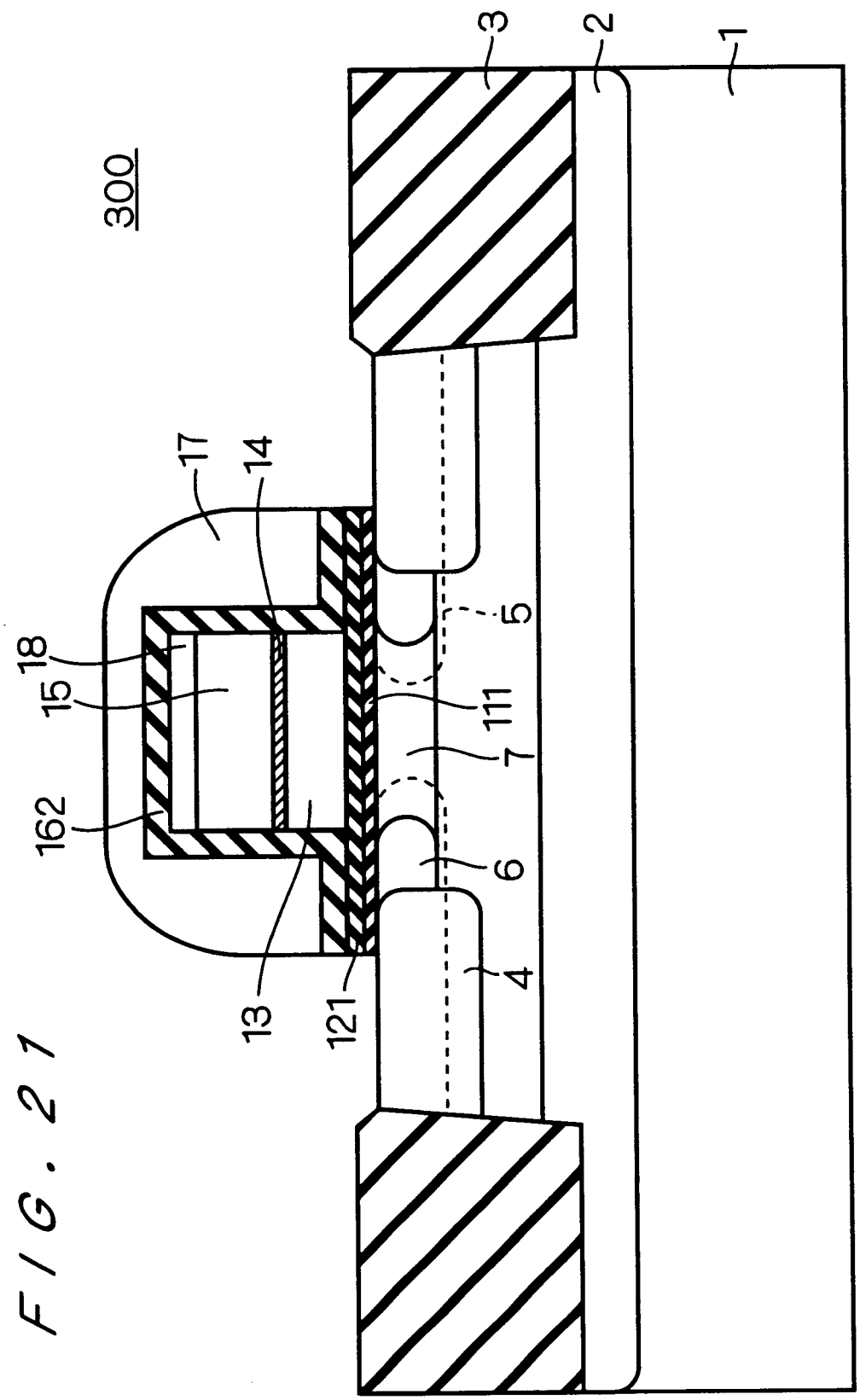
FIG. 21 is a sectional view showing a modified example of the structure of the MOSFET of the third preferred embodiment of the invention.

That is to say, in the MOSFET 300 shown in FIG. 21, the silicon oxide film 111 which contains deuterium and the silicon nitride film 121 which contains deuterium extend also under the sidewall insulating film 17 and the coating insulating film 162 extends between the sidewall insulating film 17 and the silicon nitride film 121.

With this structure, the coating insulating film 162 and the gate insulating film are in contact in a larger area, so that the coating insulating film 162 formed of silicon oxide film containing deuterium is more desirable in that it does not affect the gate insulating film.

While FIG. 21 shows a structure in which anisotropic etching to the gate electrode is stopped on the silicon nitride film 121, the silicon nitride film 121 is actually somewhat over-etched.

The above-described first to third preferred embodiments of the present invention have shown applications of the invention to MOSFETs. However, the present invention can also be applied to flash EEPROMs (Electrically Erasable Programmable Read Only Memories), LDMOSFETs (Lateral Diffusion MOSFETs) and DTMOSFETs (Dynamic Threshold MOSFETs).

Also, while the above-described first to third preferred embodiments have mainly explained structures using an ON film as the gate insulating film, ONO (Oxide-Nitride-Oxide) film, $SiO_2/SiON$ film, $SiO_2/SiON/SiO_2$ film, SiN/SiON film can be used; their film thickness may be adjusted for individual functional blocks, or deuterium may be contained in the films.

Further, while a silicon oxide film which contains deuterium or a silicon oxynitride film which contains deuterium have been described as examples of the coating insulating film 162 in the third preferred embodiment, the effects of the third preferred embodiment can be obtained also with structures in which the coating insulating film 162 is composed of a multi-layered film of ONO film, $SiO_2/SiON$ film, $SiO_2/SiON/SiO_2$ film, SiON/SiN film, etc., in which case deuterium can be contained in any layers.

<D. Fourth Preferred Embodiment>

While the second preferred embodiment of the invention has shown structures using a deuterium-containing ON film as a gate insulating film, the functions and effects of the semiconductor device of the second preferred embodiment can be obtained if the silicon nitride film of the ON film contains a reduced amount of hydrogen atoms.

Figure 48:
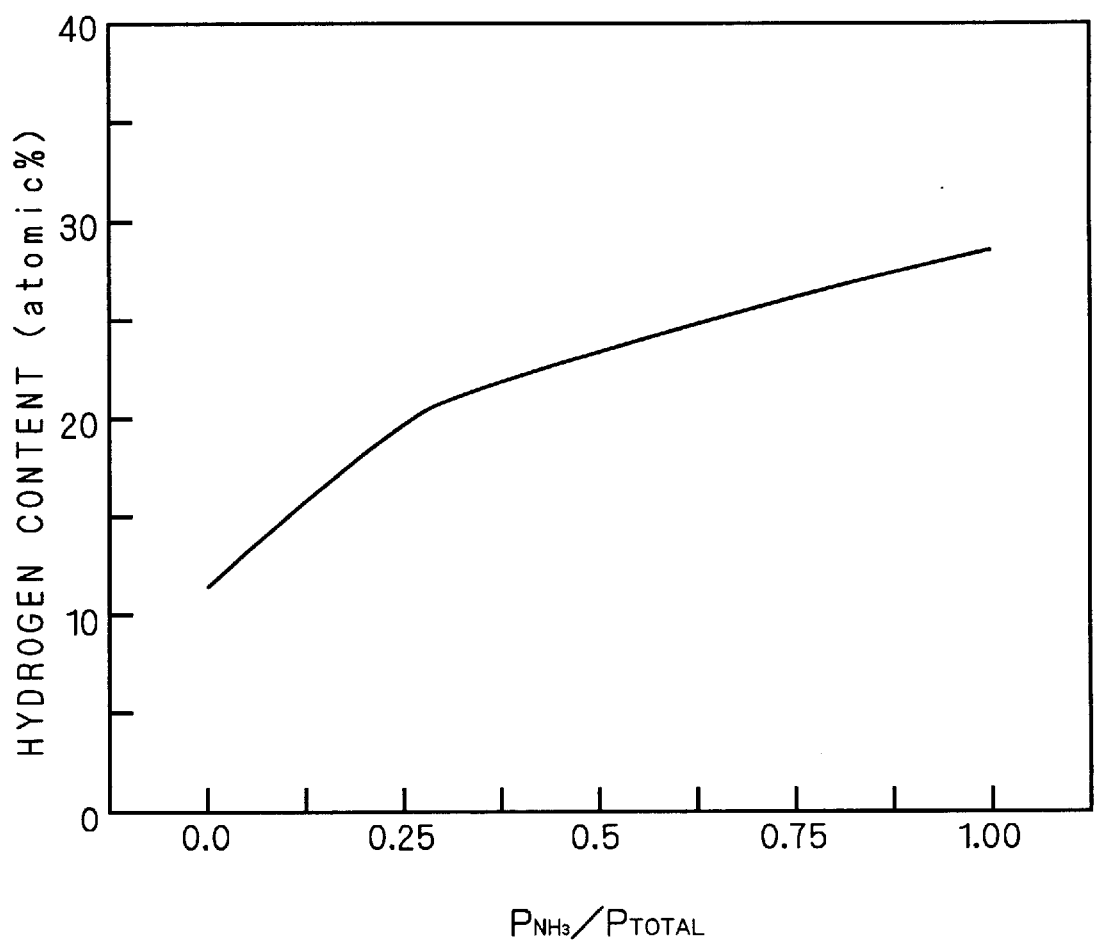
FIG. 48 is a diagram showing the dependence of hydrogen atom content in silicon nitride film on the partial pressure of ammonia gas.

That is to say, in the chemical reaction expressed by Formula (1) explained referred to FIG. 48, the content of hydrogen atoms in the silicon nitride film becomes higher as the partial pressure of ammonia in the source gas becomes higher.

Accordingly the content of hydrogen atoms can be reduced by forming the silicon nitride film using the chemical reaction expressed by Formula (2).

Reducing the hydrogen atom content reduces the amount of interface states and fixed charges formed because of drift or thermal diffusion of hydrogen atoms in the ON film, thus improving the hot carrier resistance.

<E. Fifth Preferred Embodiment>
<E-1. Device Structure>

Next, a fifth preferred embodiment of the present invention is described referring to FIGS. 22 to 32.

Figure 22:
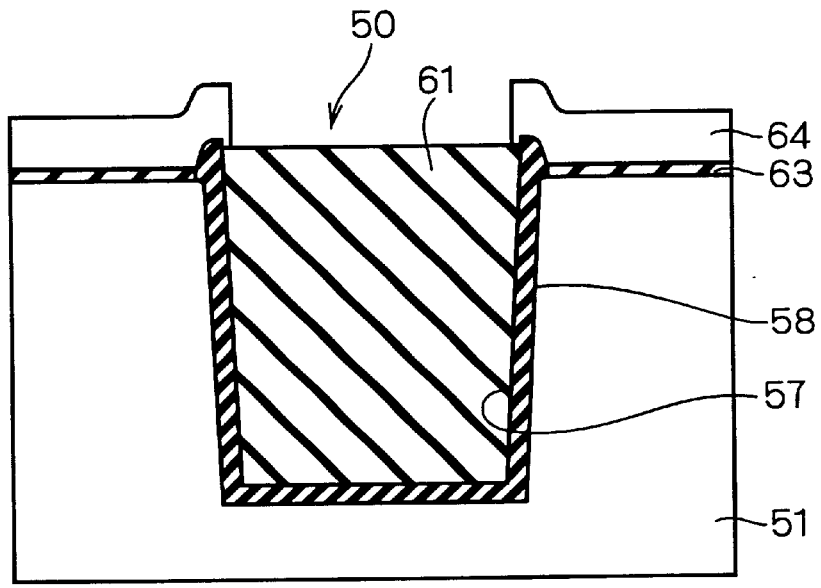
FIG. 22 is a sectional view showing an STI film according to a fifth preferred embodiment of the present invention.

FIG. 22 is a diagram showing the characteristic part of a semiconductor device of the fifth preferred embodiment of the invention. In FIG. 22, an STI film 50 is formed in the surface of a silicon substrate 51. At the top edges of the STI film 50, an inner-wall oxide film 58 forms gently raised edges on the main surface of the silicon substrate 51, and an edge in the gate width direction of a MOSFET gate electrode 64 is engaged with the edge of the inner-wall oxide film. 58.

The STI film 50 includes a trench 57 formed in the surface of the silicon substrate 51, the inner-wall oxide film 58 formed on its inner walls, and a buried insulating film 61 buried in the trench 57. FIG. 22 shows the cross section in the width direction of the gate electrode 64, where a gate insulating film 63 is formed between the gate electrode 64 and the silicon substrate 51.

The STI film 50 thus constructed is characterized in that the inner-wall oxide film 58 and the buried insulating film 61 contain deuterium.

<E-2. Manufacturing Method>

A method for forming the STI film 50 is now described referring to FIGS. 23 to 30 which show the manufacturing process steps in order.

Figure 23:
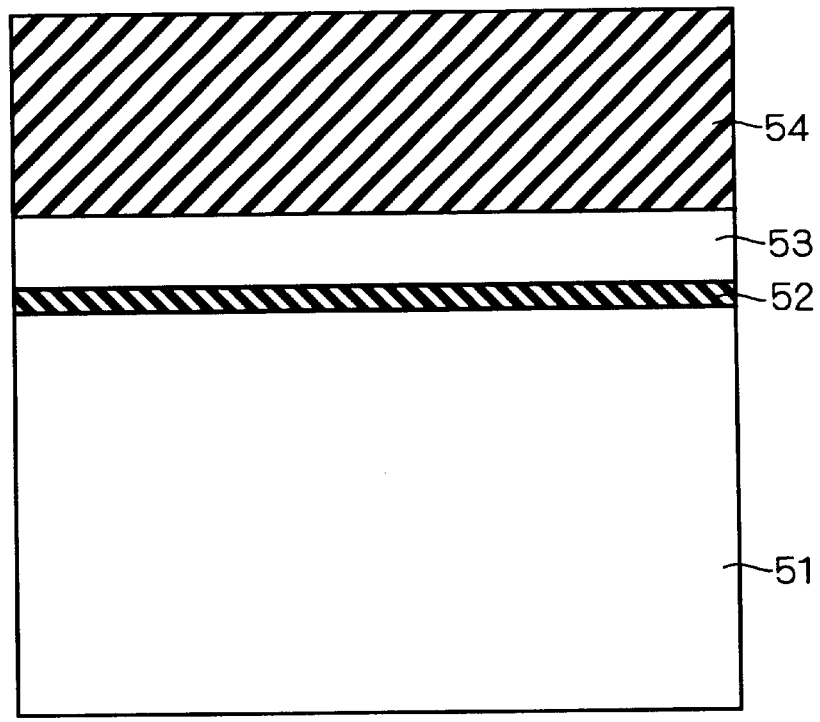
FIGS. 23 to 30 are sectional views showing a process of manufacturing the STI film of the fifth preferred embodiment of the invention.

First, in the process shown in FIG. 23, the silicon substrate 51 is prepared and a silicon oxide film 52, a polysilicon film (or amorphous silicon film) 53 and a silicon nitride film 54 are deposited in this order on the silicon substrate 51.

The silicon oxide film 52 is a film for facilitating partial oxidation of the inner-wall oxide film 58 and the polysilicon film 53 is a film for alleviating stress around bird's beaks of the silicon oxide film formed by subsequent processing.

Figure 24:
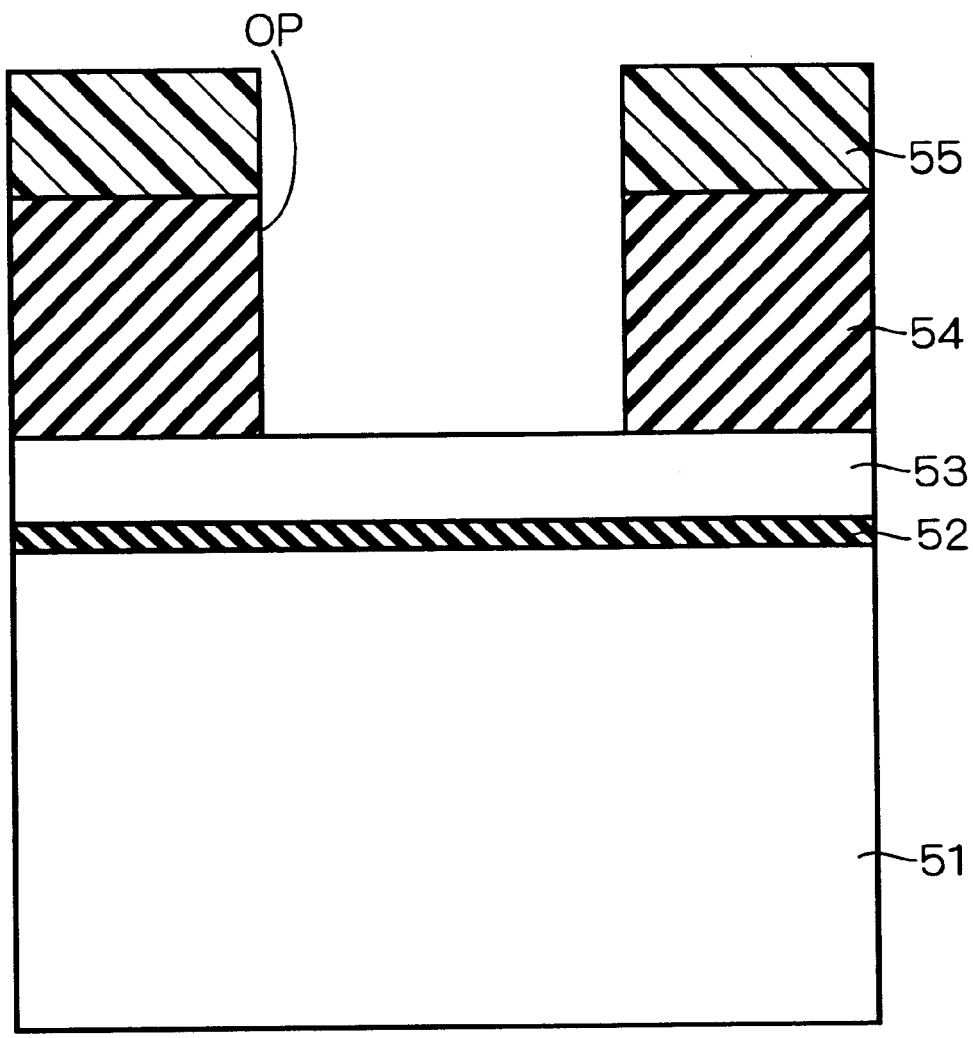

Next, in the process shown in FIG. 24, the silicon nitride film 54 is patterned by using a resist mask 55 formed by a transfer process to form an opening OP reaching the polysilicon film 53. The opening pattern of the resist mask 55 is set in correspondence with the pattern of the trench formed in the silicon substrate 51.

Figure 25:
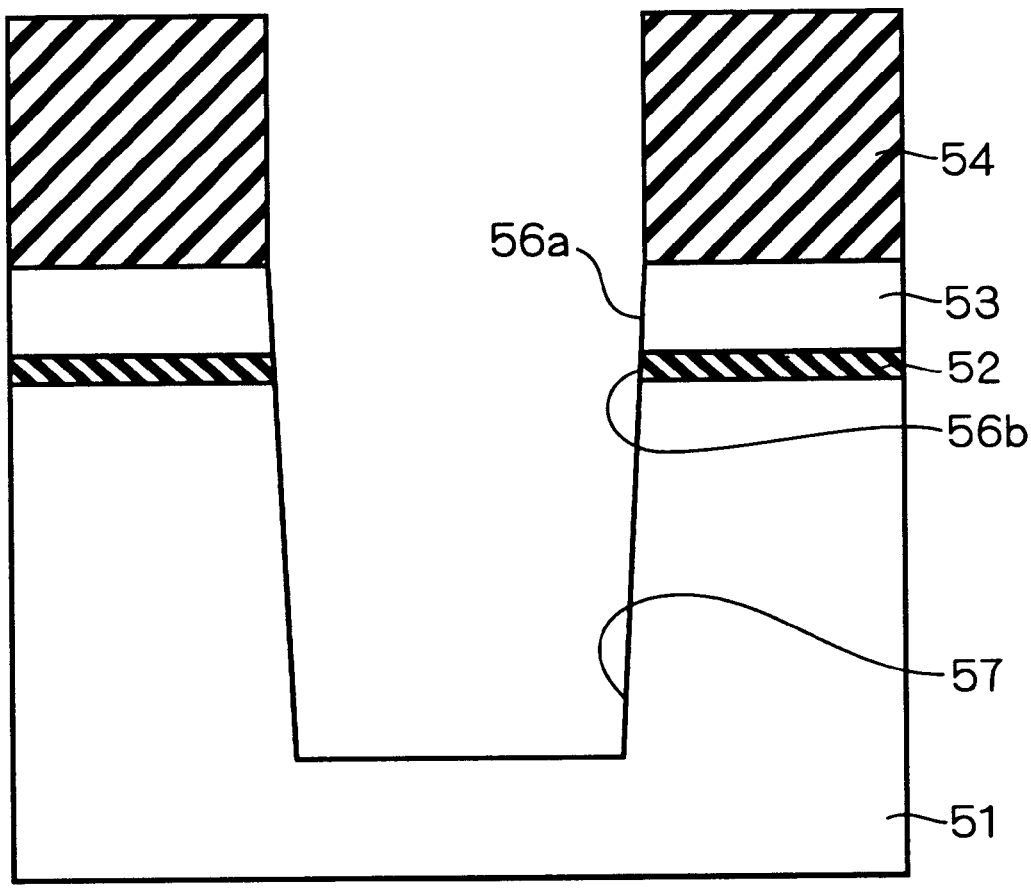

Next, after removal of the resist mask 55, in the process shown in FIG. 25, the silicon substrate 51 is anisotropically etched using the silicon nitride film 54 as a hard mask to form the trench 57. In this step, the opening of the trench 57 continues to the opening 56b in the silicon oxide film 52 and the opening 56a in the polysilicon film 53.

Figure 26:
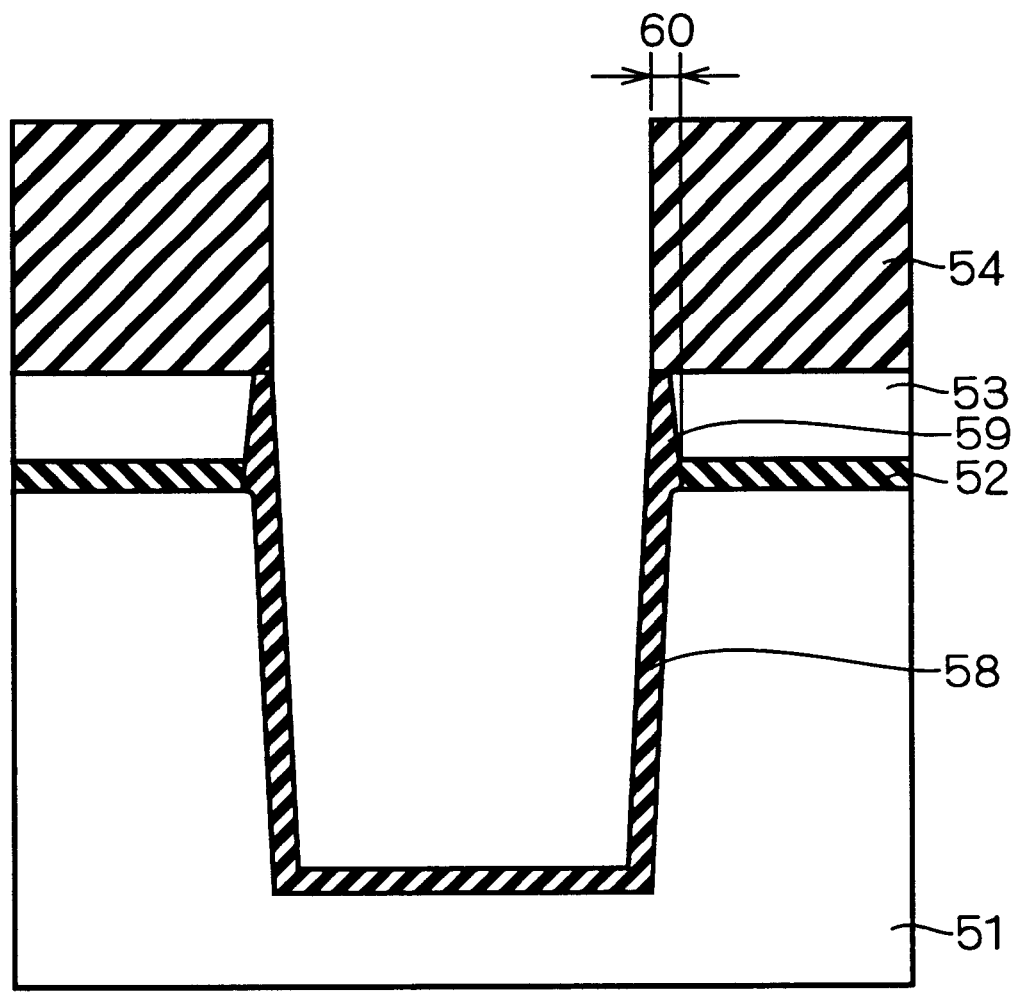

Next, in the process shown in FIG. 26, oxidation or oxynitridation is applied to the inner wall of the trench 57 to form the inner-wall oxide film 58 of silicon oxide film or silicon oxynitride film.

The inner-wall oxide film 58 can be formed by utilizing chemical reactions expressed by Formulas (7) to (12), (14), (16) to (19); the silicon oxide film or silicon oxynitride film obtained by the chemical reactions contain deuterium.

In FIG. 26, the inner-wall oxide film 58 is formed not only on the inner wall of the trench 57 (see FIG. 25) but also on the opening 56b of the silicon oxide film 52 (see FIG. 25) and the opening 56a of the polysilicon film 53 (see FIG. 25); particularly, the oxidation is facilitated in the opening 56b of the silicon oxide film 52 to form bird's beaks 59 having an increased thickness. In FIG. 26, a part thickened by the bird's beak 59 is shown at 60.

Though not shown, a silicon nitride film which contains deuterium may be provided to cover the inner-wall oxide film 58. The silicon nitride film can be formed by utilizing the chemical reactions expressed by Formulas (3) to (6).

Figure 27:
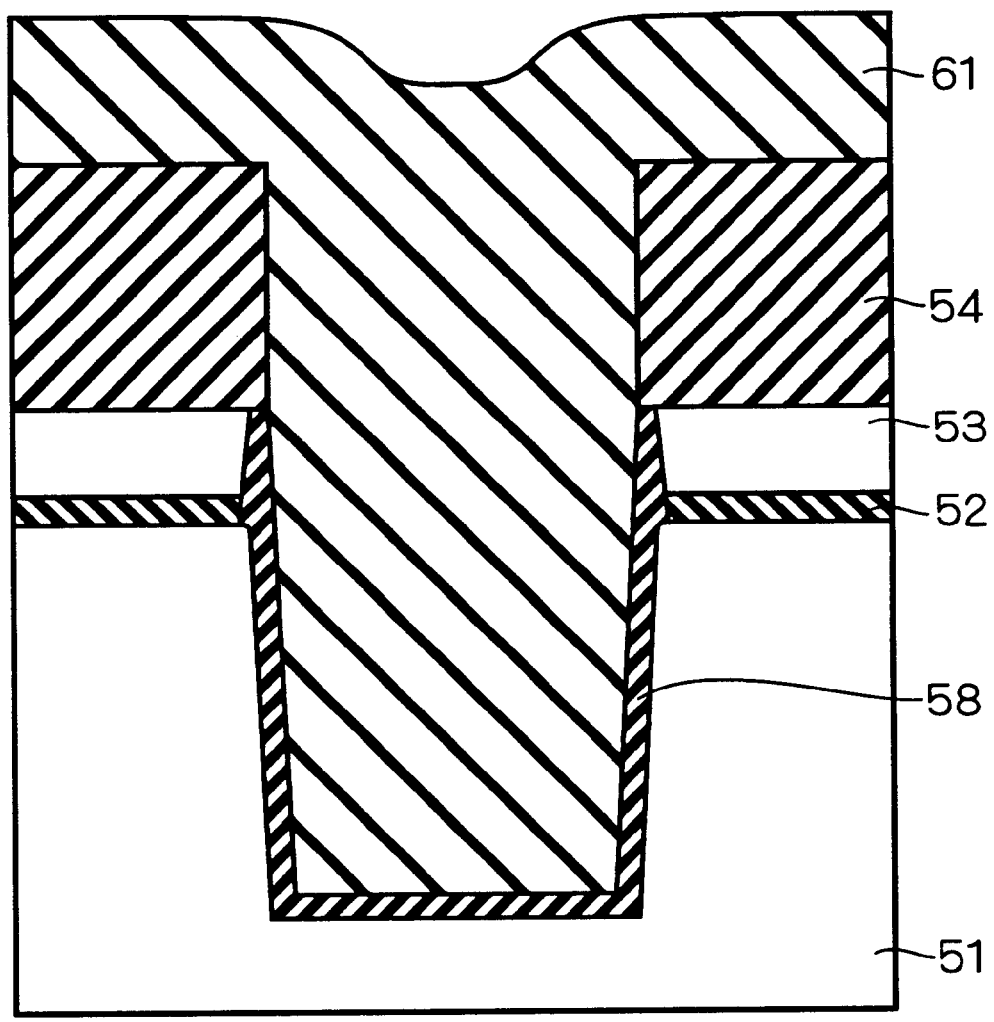

Next, in the process shown in FIG. 27, the trench 57 is filled with the buried insulating film 61 composed of silicon oxide film, silicon oxynitride film, TEOS film, HDP silicon oxide film, etc., for example.

The buried insulating film 61 can be formed by utilizing chemical reactions expressed by Formulas (7) to (12), (14), (16) to (19); insulating films obtained by the chemical reactions contain deuterium.

Next, it is thermally processed in an atmosphere of deuterium, argon, or nitrogen. This thermal process is done for densification of the buried insulating film 61 and for alleviation of stress around the STI film 50 by utilizing the viscous flow property of the insulating film 61.

An insulating film which contains deuterium is a material effective for stress alleviation since it becomes softer as it contains a larger amount of deuterium.

Since deuterium atoms in the insulating film combine with silicon atoms stronger than hydrogen atoms do, only a small amount of deuterium atoms volatilize even when thermally processed at high temperatures of about 800 to 1200° C. The volatilization of deuterium atoms can be further suppressed by performing thermal process in a deuterium atmosphere or in a low-temperature high-pressure atmosphere.

Figure 28:
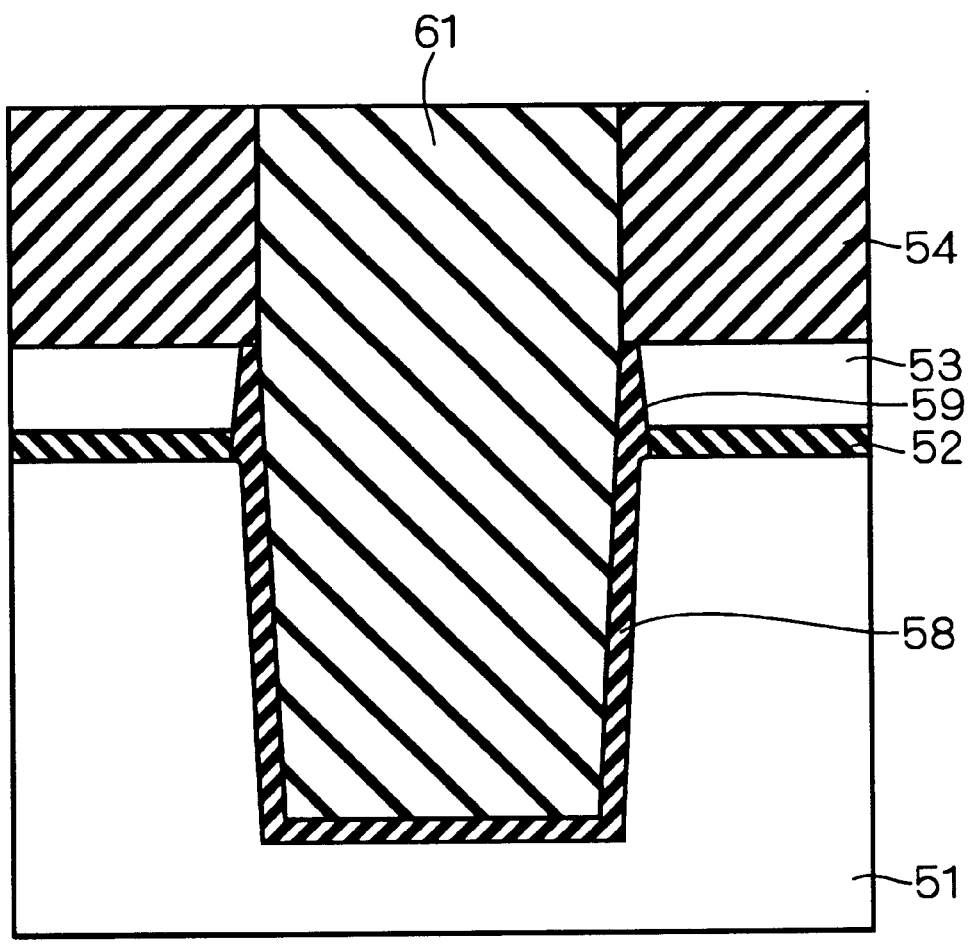

Next, in the process shown in FIG. 28, planarization is applied onto the top surface of the buried insulating film 61 by CMP (Chemical Mechanical Polishing) using the silicon nitride film 54 as a stopper.

Figure 29:
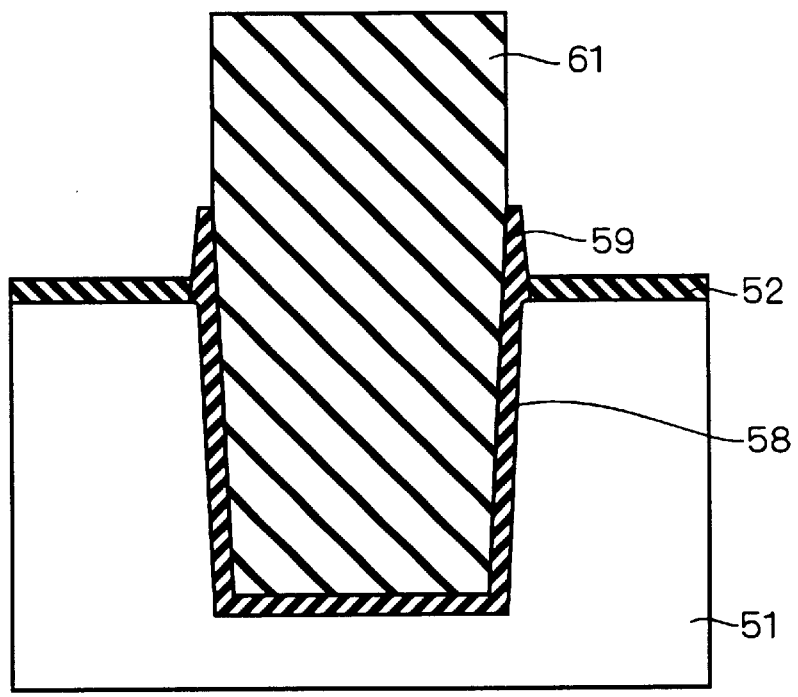

Next, in the process shown in FIG. 29, the silicon nitride film 54 and polysilicon film 53 are removed by etching. In this step, an unwanted part of the buried insulating film 61 is left in the part which was surrounded by the silicon nitride film 54 and the polysilicon film 53.

Figure 30:
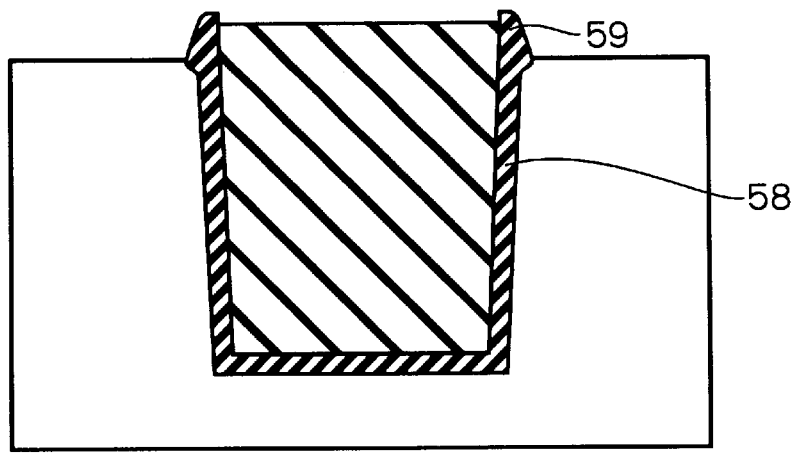

Next, in the process shown in FIG. 30, the unwanted part of the buried insulating film 61 is etched away to form the STI film 50. In this process, the silicon oxide film 52 and part of the inner-wall oxide film 58 around the unwanted part of the buried insulating film 61 are also removed, and the edges of the inner-wall oxide film 58 which have been thickened by the bird's beaks 59 remain as round protrusions at the top edges of the buried insulating film 61.

Finally, the gate insulating film 63 is formed on the silicon substrate 51 and the gate electrode 64 is formed on the gate insulating film 63 to obtain the structure shown in FIG. 22.

<E-3. Functions and Effects>

Figure 31:
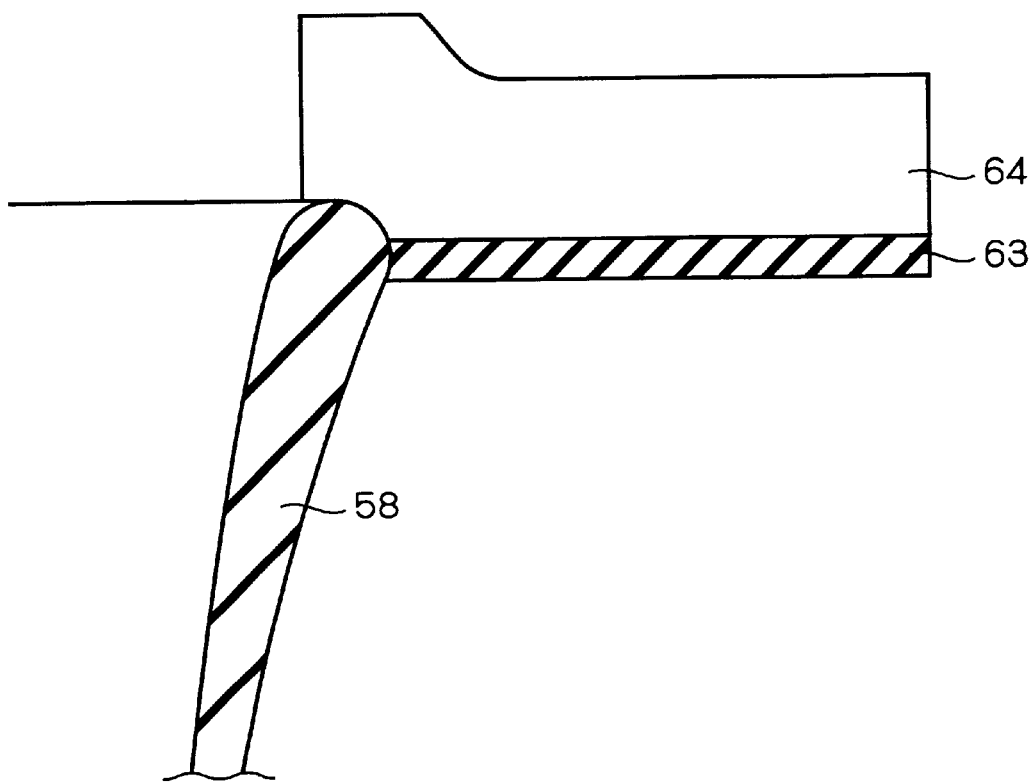
FIG. 31 is a partial sectional view showing the STI film of the fifth preferred embodiment of the invention.

FIG. 31 shows in an enlarged manner the structure around a top edge of the STI film 50 of FIG. 22. As shown in FIG. 31, in the STI film 50 with which the gate electrode 64 engage, when interface states and traps are formed by hot carriers etc. at the interface between the inner-wall oxide film 58 and the silicon substrate 51, the current driving capability of the MOSFET having the gate electrode 64 is reduced, as in the case of a gate insulating film.

However, when deuterium is contained in the inner-wall oxide film 58 of the STI film 50, the deuterium terminates dangling bonds in the inner-wall oxide film 58, thus improving the hot carrier resistance and hence the reliability.

Further, the use of the STI film 50 having the buried insulating film 61 which contains deuterium provides the effect of preventing the deuterium in the inner-wall oxide film 58 from volatilizing in subsequent thermal processing.

Needless to say, the STI film 50 can be used to define an active region and a MOSFET having the multi-layered gate insulating film which contains deuterium atoms as explained in the first to third preferred embodiments can be formed there.

<E-4. Effects of Polysilicon Film>

In the above-described structure, the silicon oxide film 52 and polysilicon film 53 are formed on the silicon substrate 51 in the process shown in FIG. 23. The polysilicon film 53 is a component which is necessary for the purpose of causing the inner-wall oxide film 58 to remain as edges thickened and raised by the bird's beaks 59 at the top edges of the buried insulating film 61 in the process of etching away the unwanted part of the buried insulating film 61 in the step explained referring to FIG. 30.

Figure 32:
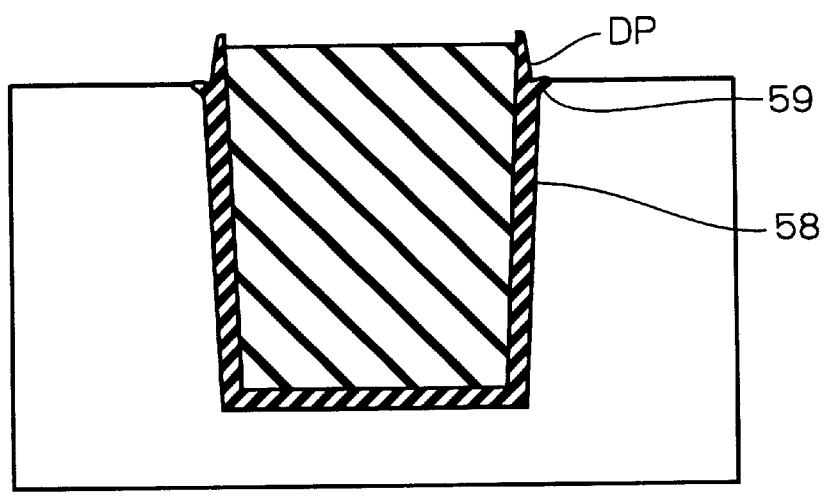
FIG. 32 is a sectional view used to explain excessive etching of the STI film of the fifth preferred embodiment of the invention.

FIG. 32 is a diagram showing the STI film 50 formed without formation of the polysilicon film 53, where the inner-wall oxide film 58 has a dent portion DP at the top edges of the buried insulating film 61.

This results from the fact that the inner-wall oxide film 58 was formed lower around the unwanted part of the buried insulating film 61 (see FIG. 29) because of the absence of the polysilicon film 53 and the inner-wall oxide film 58 was excessively etched away.

The formation of the dent portion DP at the top edges of the inner-wall oxide film 58 is undesirable for the following reason. That is, in this case, the edge in the gate width direction of the gate electrode 64 which is formed to engage with this part is dented, too, and then the electric field is concentrated at this part to cause the MOSFET to turn on at voltage lower than the designed value of the threshold voltage (Reverse Narrow Channel Effect). The polysilicon film 53 serves to prevent this.

<F. Sixth Preferred Embodiment>
<F-1. Device Structure>

Next, a sixth preferred embodiment of the present invention is now described referring to FIGS. 33 to 42.

Figure 33:
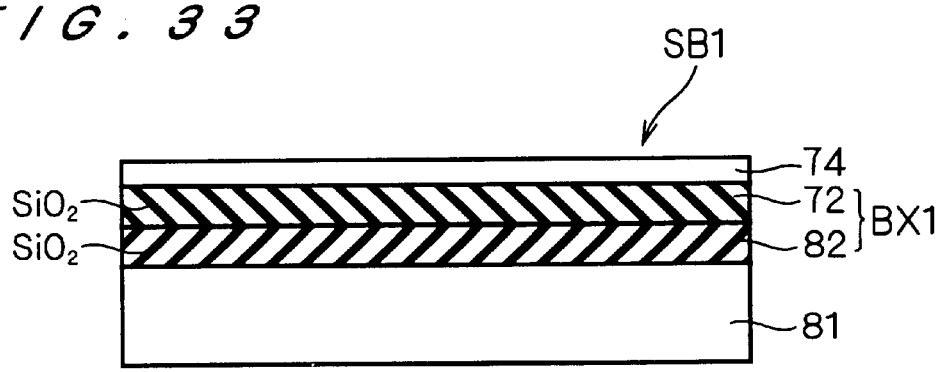
FIG. 33 is a sectional view showing the structure of an SOI substrate according to a sixth preferred embodiment of the present invention.

FIG. 33 is a sectional view showing the structure of an SOI substrate SB1 according to the sixth preferred embodiment of the present invention.

The SOI substrate SB1 has a buried insulating film BX1 as BOX (Buried Oxide) film and an SOI layer 74 multilayered on a silicon substrate 81. This structure is characterized in that deuterium is contained in the buried insulating film BX1 and at the interfaces between the buried insulating film BX1 and adjacent layers.

<F-2. Manufacturing Method>

A method for manufacturing the SOI substrate SB1 is now described referring to FIGS. 34 to 37 which show the process steps in order.

Figure 34:
FIGS. 34 to 37 are sectional views showing a process of manufacturing the SOI substrate of the sixth preferred embodiment of the invention.

First, in the process shown in FIG. 34, a silicon substrate 71 is prepared and its main surface is cleaned. Then the silicon oxide film 72 which contains deuterium is formed by using the reaction of Formula (7), for example.

Figure 35:
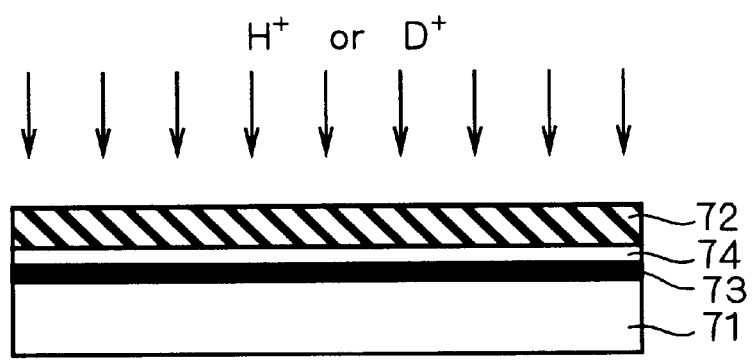

Next, in the process shown in FIG. 35, hydrogen ions or deuterium ions are implanted from above the silicon oxide film 72 to form an implanted layer 73. The dose is about $1 \times 10^{16}$ to $1 \times 10^{17}/cm^2$. The implant energy is determined so that the sum of the film thickness of the silicon oxide film 72 and that of the part which forms the SOI layer 74 later approximately corresponds to the peak position of the implanted ion concentration distribution. In FIG. 35, the region where the concentration of hydrogen or deuterium atoms reaches the peak is shown as the implanted layer 73.

The bond between silicon atoms and deuterium atoms is stronger than that between silicon atoms and hydrogen atoms. Therefore implanting deuterium ions is more desirable to facilitate the separation of substrate in the substrate separation process shown later referring to FIG. 37.

Figure 36:
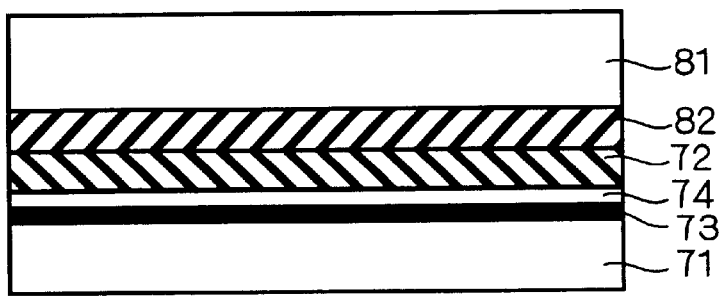

Next, in the process shown in FIG. 36, the silicon substrate 81 is prepared and its main surface is cleaned, and then the silicon oxide film 82 is formed. Then, as shown in FIG. 36, the silicon substrate 81 and the silicon substrate 71 are combined at room temperature, with the silicon oxide film 82 in the main surface of the silicon substrate 81 and the silicon oxide film 72 in the main surface of the silicon substrate 71 abutting on each other.

Figure 37:
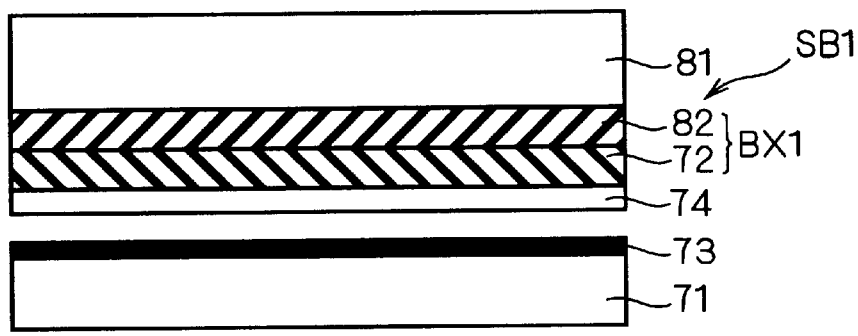

Next, in the process shown in FIG. 37, thermal treatment is applied twice to the silicon substrates 71 and 81 bonded to each other.

The first thermal process is performed at 400 to 600° C., where the silicon substrate 71 and implanted layer 73 are separated from the bonded structure of the silicon substrates 71 and 81 along the implanted layer 73 containing hydrogen or deuterium.

The implanted layer 73 has become amorphous silicon since hydrogen atoms or deuterium atoms were heavily implanted therein, and dangling bonds of silicon atoms are terminated by the hydrogen atoms or deuterium atoms. On the other hand, the bond between silicon atoms at the interface of the implanted layer 73 and the SOI layer 74 is weak. Consequently, the structure is separated along the implanted layer 73.

As a result, the single-crystal silicon layer on top of the implanted layer 73 remains over the main surface of the silicon substrate 81 as the SOI layer 74 and the silicon oxide films 72 and 82 form the buried insulating film BX1, thus forming the SOI substrate SB1.

The second thermal process is performed at about 1100° C. to strengthen chemical bonds in the SOI substrate SB1.

The surface of the SOI substrate SB1 has micro roughness as large as about 10 nm immediately after the second thermal process. Accordingly it is polished to reduce the micro roughness to 0.15 nm or less to complete the SOI substrate SB1 explained referring to FIG. 33.

<F-3. Functions and Effects>

As explained above, the SOI substrate of the sixth preferred embodiment of the invention uses the SOI substrate SB1 which contains deuterium in the buried insulating film BX1 and at the interfaces between the buried insulating film BX1 and adjacent layers. Since the bond energy between silicon atoms and deuterium in the buried insulating film BX1 is larger than the bond energy between silicon atoms and hydrogen atoms, interface states and fixed states are less likely to form. This enhances the reliability of the semiconductor device formed on the SOI substrate SB1.

The silicon oxide film 82 is not essential, and it is not essential, either, to contain deuterium in the silicon oxide film 82. The functions and effects of the invention can be obtained as long as the silicon oxide film 72 adjacent to the SOI layer 74 contains deuterium.

<F-4. Modifications>

Structures of modified examples of this preferred embodiment are now described referring to FIGS. 38 to 42.

Figure 38:
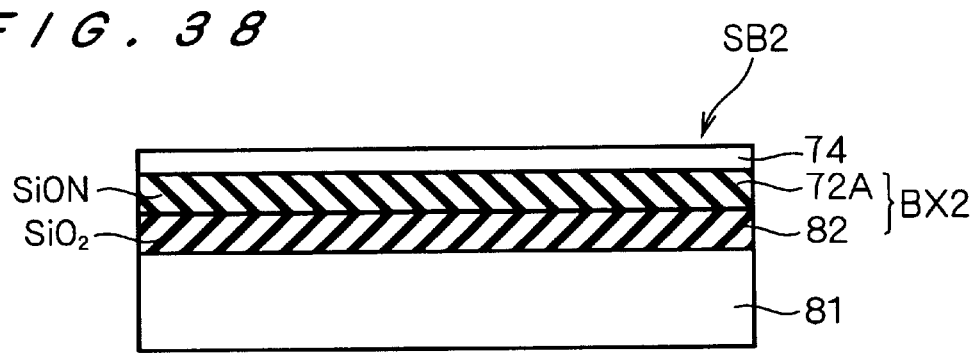
FIGS. 38 to 42 are sectional views used to explain modified examples of the SOI substrate of the sixth preferred embodiment.

In the SOI substrate SB2 shown in FIG. 38, a silicon oxynitride film (SiON) 72A adjoins the SOI layer 74 to form a buried insulating film BX2. In other respects the structure is the same as that of the SOI substrate SB1 shown in FIG. 33.

Figure 39:
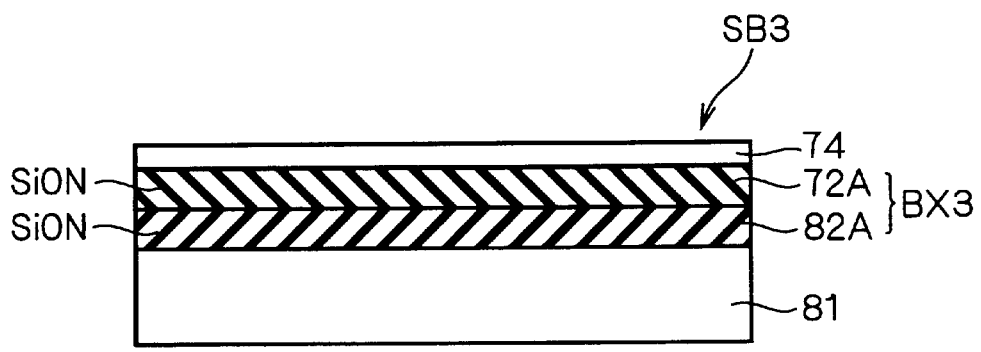

In the SOI substrate SB3 shown in FIG. 39, the silicon oxynitride film 72A adjoins the SOI layer 74 and a silicon oxynitride film 82A is provided under the silicon oxynitride film 72A to form a buried insulating film BX3. In other respects the structure is the same as that of the SOI substrate SB1 shown in FIG. 33.

Figure 40:
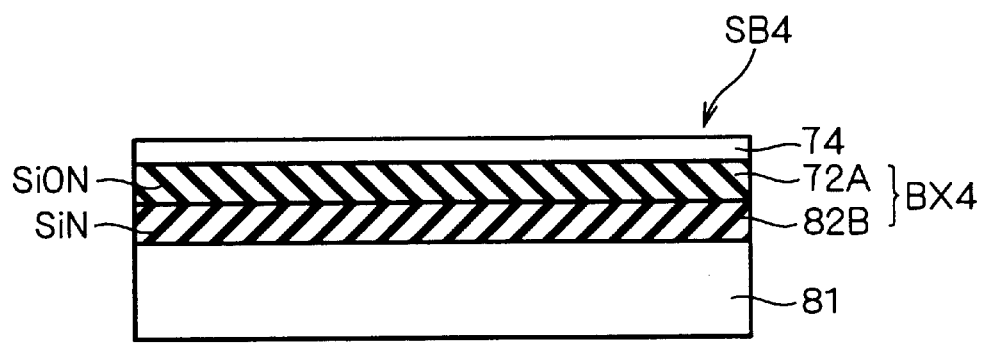

In the SOI substrate SB4 shown in FIG. 40, the silicon oxynitride film 72A adjoins the SOI layer 74 and a silicon nitride film 82B is provided under the silicon oxynitride film 72A to form a buried insulating film BX4. In other respects the structure is the same as that of the SOI substrate SB11 shown in FIG. 33.

Figure 41:
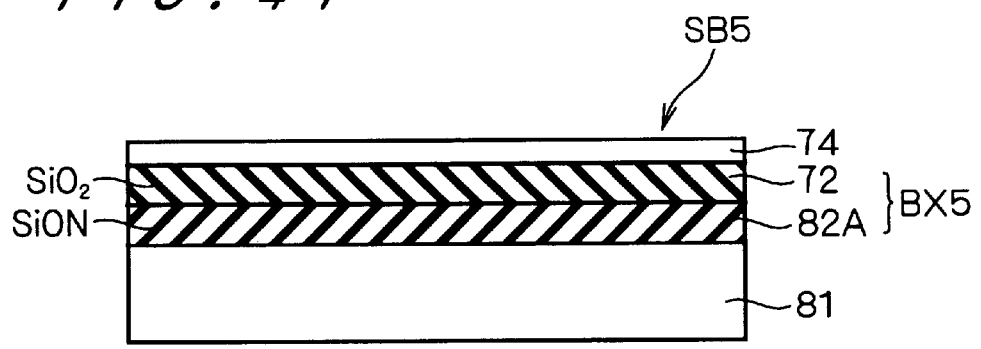

In the SOI substrate SB5 shown in FIG. 41, the silicon oxynitride film 82A is provided under the silicon oxide film 72 adjacent to the SOI layer 74 to form a buried insulating film BX5. In other respects the structure is the same as that of the SOI substrate SB1 shown in FIG. 33.

Figure 42:
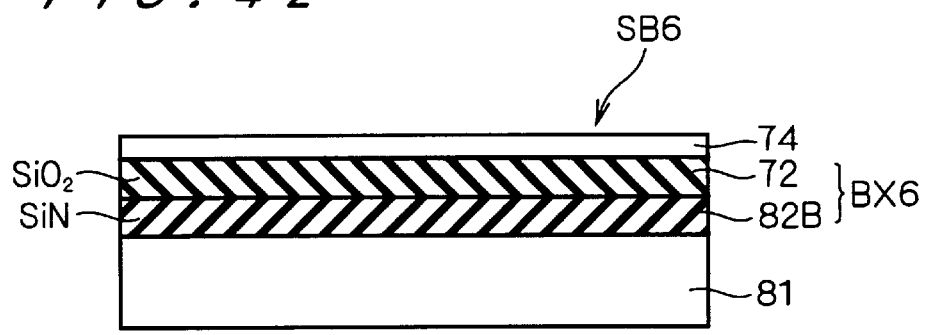
Figure 43:
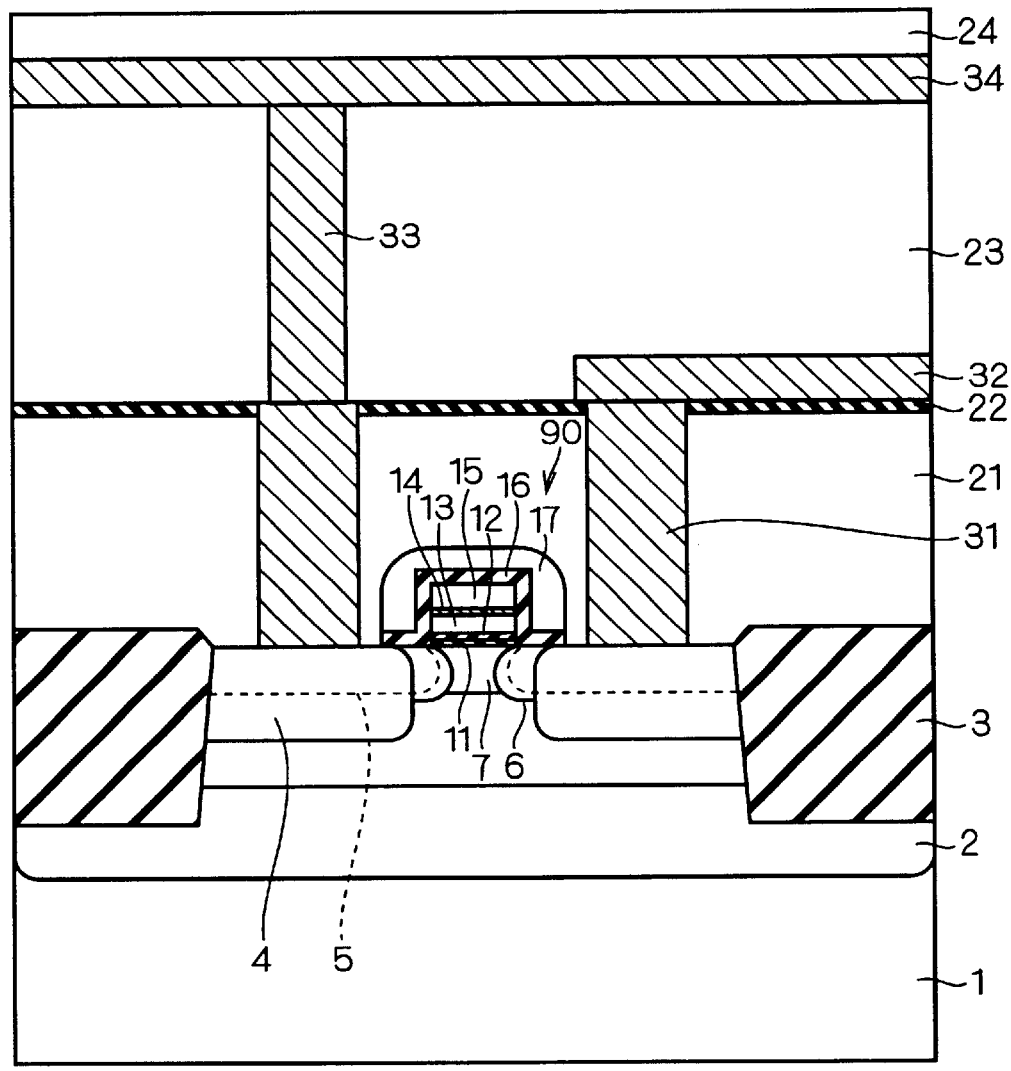
FIG. 43 is a sectional view showing the structure of a conventional MOSFET.
Figure 45:
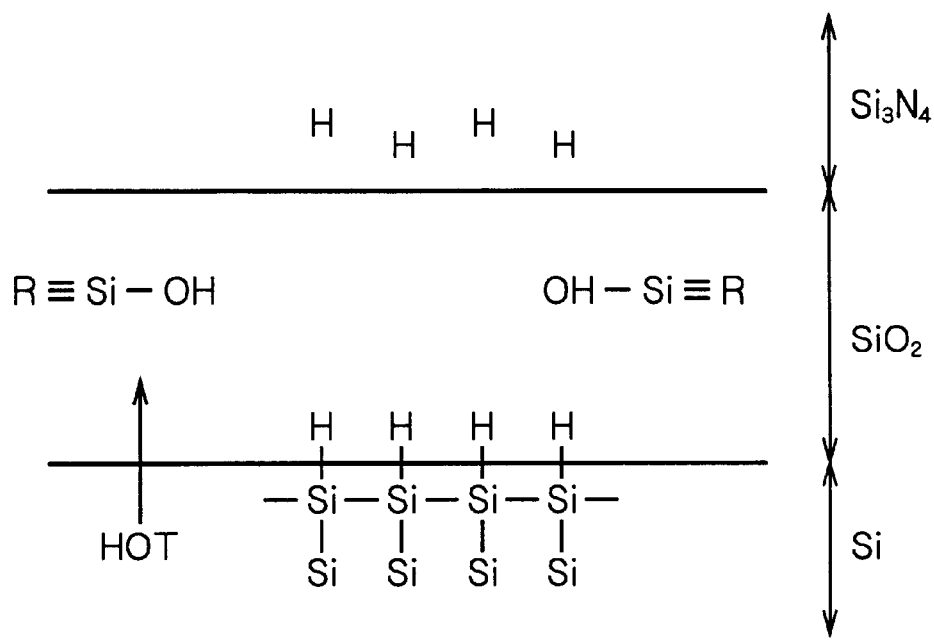
FIGS. 45 to 47 are schematic diagrams used to explain how hydrogen atoms in an ON film behave when a stress voltage is applied.
Figure 46:
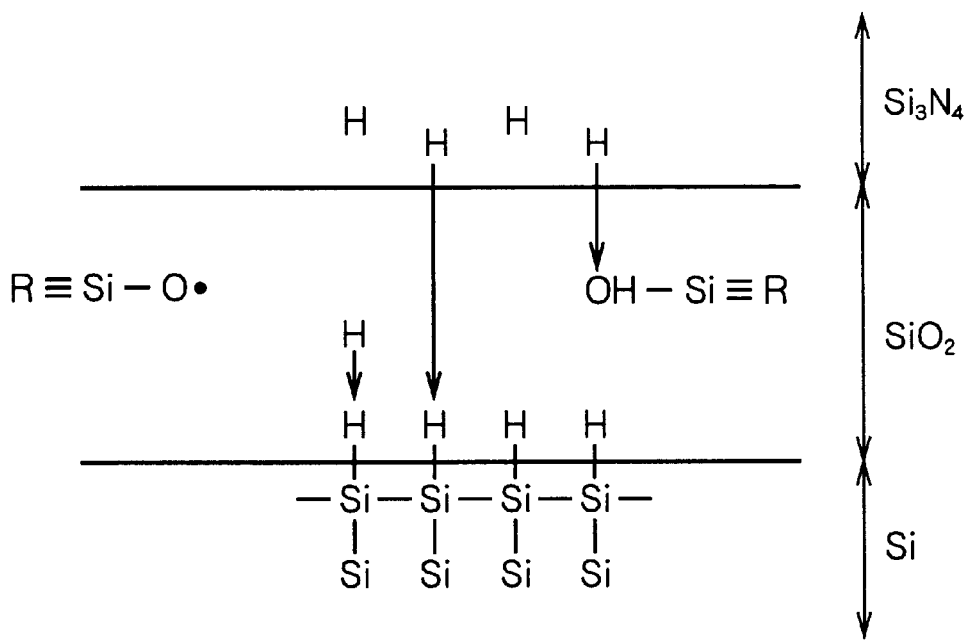
Figure 47:
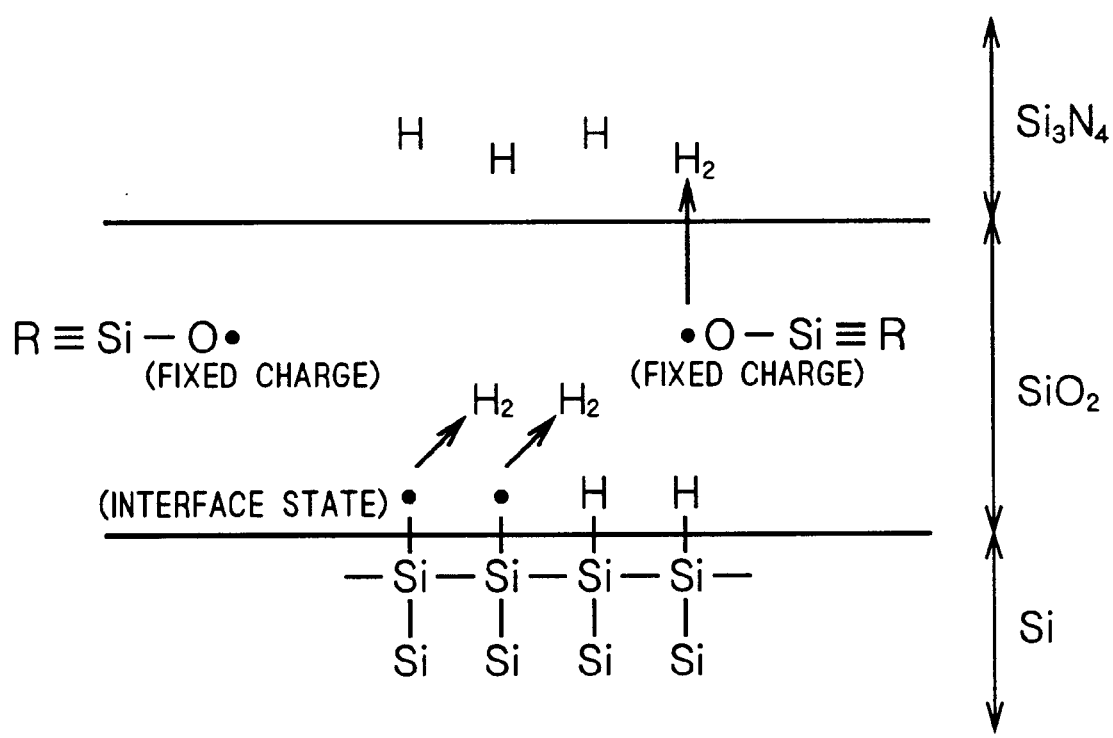

In the SOI substrate SB6 shown in FIG. 42, the silicon nitride film 82B is provided under the silicon oxide film 72 adjacent to the SOI layer 74 to form a buried insulating film BX6. In other respects the structure is the same as that of the SOI substrate SB1 shown in FIG. 33.

The above-described SOI substrates SB2 to SB6 have, instead of the buried insulating film BX1, a multilayer film of silicon oxynitride film and silicon oxide film, a multilayer film of silicon oxynitride films, a multilayer film of silicon oxynitride film and silicon nitride film, or a multilayer film of silicon oxide film and silicon nitride film; these multilayer films can be formed by utilizing chemical reactions expressed by Formulas (1) to (12), (14), (16) to (19).

In the structures shown in FIGS. 38 to 40 in which the SOI layer 74 and the silicon oxynitride film 72A are in contact with each other, nitrogen atoms in the silicon oxynitride film 72A terminate dangling bonds of silicon existing at the interface between the SOI layer 74 and the silicon oxynitride film 72A to reduce the interface states, which reduces the leakage current in OFF state of the MOSFET.

As already stated, since silicon oxynitride film has almost the same thermal expansion coefficient as silicon, a reduced amount of thermal stress is generated by the difference in thermal expansion coefficient during high temperature process.

Further, in the structure in which the silicon nitride film 82B is formed under the silicon oxide film 72 as shown in FIG. 42, the stress in the entire multilayer film can be reduced by virtue of the compressive stress occurring in the silicon oxide film 72 and the tensile stress occurring in the silicon nitride film 82B, which reduces the interface states formed at the interface with the adjacent SOI layer 74.

Moreover, sizing the thickness of the buried insulating films BX1 to BX6 in the SOI substrates SB1 to SB6 provides the same effects as the sizing of the thickness of the multilayer gate insulating films explained in the first preferred embodiment. Also, a double gate MOSFET can be formed by using the multilayer insulating film as a second gate insulating film.

Further, needless to say, a MOSFET which has a multilayer gate insulating film which contains deuterium atoms as explained in the first to third preferred embodiments can be formed on the SOI substrates SB1 to SB6, and the STI film which contains deuterium atoms as explained in the fifth preferred embodiment may be provided in the surface of the SOI substrates SB1 to SB6 to define the active region.

<F-5. Development of the Invention>

While the above-described SOI substrates of the sixth preferred embodiment of the invention are characterized in that at least the buried insulating film contains deuterium, the use of a two-layer film of silicon oxide film and silicon nitride film as the buried insulating film alleviates thermal stress whether the buried insulating film contains deuterium or not, since the silicon oxide film generates compressive stress when heated while the silicon nitride film generates tensile stress. It therefore introduces a smaller amount of thermal stress in the SOI layer than a buried insulating film having the same thickness and formed only of a silicon oxide film.

Furthermore, since the silicon oxynitride film has nearly the same thermal expansion coefficient as silicon, the buried insulating film made of a two-layer film of silicon oxide film and silicon oxynitride film introduces a smaller amount of thermal stress in the SOI layer than a buried insulating film of the same thickness which is formed only of a silicon oxide film.

Thus, using the two-layer film of silicon oxide film and silicon nitride film, the two-layer film of silicon oxide film and silicon oxynitride film, the two-layer film of silicon nitride film and silicon oxynitride film, or the two-layer film of silicon oxide film and silicon oxynitride film as a buried insulating film alleviates thermal stress even if they contain no deuterium, and which reduces interface state generation at the interface with the adjacent SOI layer. This provides the effect of reducing defects formed during the manufacturing process, thus reducing the leakage current of the semiconductor device such as a MOSFET. Needless to say, containing deuterium in the films further enhances the reliability of the semiconductor device, such as a MOSFET, formed on the SOI substrate.

The buried insulating film is not limited to a two-layer film; it can be an ONO (Oxide-Nitride-Oxide) film or a multilayer film composed of any of silicon oxide film, silicon nitride film and silicon oxynitride film.

Figure 49:
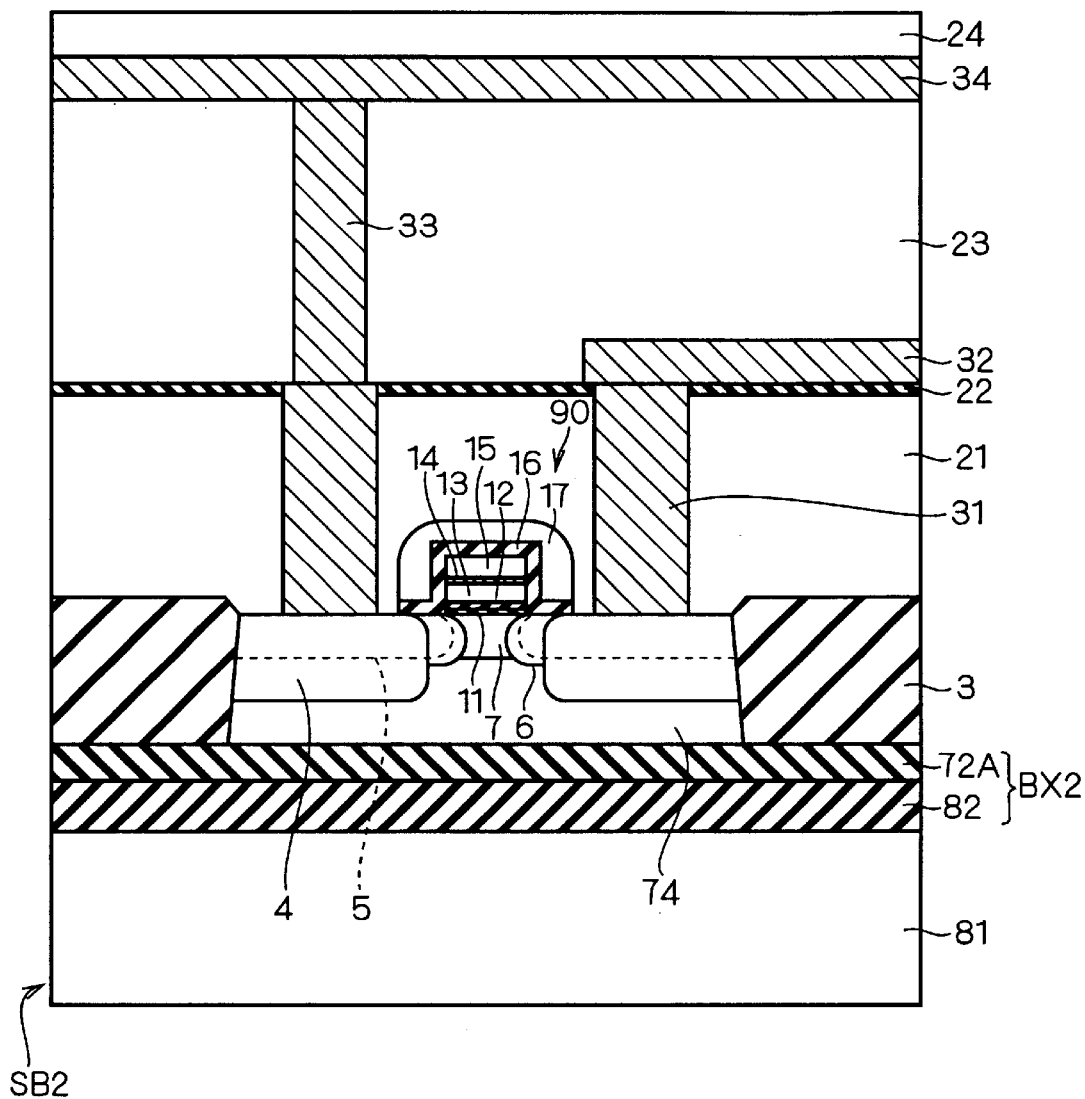

Now, by way of example, FIG. 49 shows a structure in which the MOSFET 90 is provided on the SOI substrate SB2 having the multilayer buried insulating film BX2.

In FIG. 49, the MOSFET 90 has a gate insulating film composed of a two-layer film of the silicon oxide film 11 and the silicon nitride film 12 provided in order on the SOI layer 74 of the SOI substrate SB2, and a gate electrode composed of a three-layer film of the doped polysilicon film 13, barrier metal layer (WNx, TiNx, Ta, TaN, etc.) 14 and metal film 15 provided in order on the silicon nitride film 12.

The MOSFET 90 has the coating insulating film 16 covering the gate insulating film and gate electrode, the sidewall insulating film 17 covering at least the sides of the coating insulating film 16, the channel layer 7 provided in the surface of the SOI layer 74 under the gate electrode, the pair of extension layers 6 facing each other through the channel layer 7, the pocket layers 5 provided in the pair of extension layers 6, and the pair of main source/drain layers 4 adjacent to the pair of extension layers 6.

The active region of the MOSFET 90 is defined by the STI film 3, a kind of element isolation insulating film, and the bottom of the STI film 3 is formed to reach the buried insulating film BX2. The first interlayer insulating film 21, insulating film 22, second interlayer insulating film 23 and third interlayer insulating film 24 are multilayered over the MOSFET 90.

FIG. 49 shows the structure including contacts 31 passing through the first interlayer insulating film 21 and the insulating film 22 to reach the pair of main source/drain layers 4, the first interconnection layer 32 connected to one of the contacts 31, the contact 33 passing through the second interlayer insulating film 23 to reach the other contact 31, and the second interconnection layer 34 connected to the contact 33. This structure is just an example and other structures are also possible.

The structure of the SOI substrate SB2 and buried insulating film BX2 is not explained again here since they have the structure explained referring to FIG. 38. Needless to say, the leakage current of the semiconductor device, e.g. MOSFET, can be reduced as stated above even if the buried insulating film BX2 does not contain deuterium.

While the MOSFET 90 is a conventional semiconductor device, the MOSFET 100 of the invention described referring to FIG. 8 in the second preferred embodiment, of course, can be formed on the SOI substrate SB2.

While FIG. 49 shows the bottom of the STI film 3 reaching the buried insulating film BX2, the SOI layer 74 may be present between the bottom of the STI film 3 and the buried insulating film BX2 as shown in FIG. 50.

While the invention has been described in detail, the foregoing description is in all aspects illustrative and not restrictive. It is understood that numerous other modifications and variations can be devised without departing from the scope of the invention.

What is claimed is:

1. A semiconductor device comprising at least one kind of MOSFET which comprises:
   a gate insulating film provided on a main surface of a semiconductor substrate; and
   a gate electrode provided on said gate insulating film, said gate insulating film comprising,
   a first film including a silicon oxynitride film formed on said main surface of said semiconductor substrate, and
   a second film including a silicon nitride film formed on the silicon oxynitride film, at least one of said silicon nitride film and said silicon oxynitride film contains deuterium atoms,
   wherein one of the silicon nitride film and the silicon oxynitride film is thicker than the other film, and a thickness of each film is selected based on a voltage to be applied to said MOSFET.

2. The semiconductor device according to claim 1, wherein in said first two-layer film, said silicon oxynitride film is thicker than said silicon oxide film.

3. The semiconductor device according to claim 1, wherein in said second two-layer film, said silicon oxynitride film is thicker than said silicon nitride film.

4. The semiconductor device according to claim 1, wherein in said first and second two-layer films, their respective first layers and second layers contain deuterium atoms.

5. The semiconductor device according to claim 1, wherein said semiconductor device has a plurality of functional blocks to which different maximum applied voltages are applied, and
said at least one kind of MOSFET comprises a plurality of kinds of MOSFETs having said gate insulating films differing in thickness,
and wherein said plurality of kinds of MOSFETs are allotted in said plurality of functional blocks in accordance with the thicknesses of said gate insulating films so that said MOSFETs can withstand respective said maximum applied voltages.

6. The semiconductor device according to claim 1, wherein said at least one kind of MOSFET which further comprises,
   a coating insulating film covering a multi-layered structure of said gate insulating film and said gate electrode and partially covering said main surface of said semiconductor substrate which extend outwardly from sides of said multi-layered structure, and
   a sidewall insulating film covering said coating insulating film,
   wherein said coating insulating film contains deuterium atoms.

7. The semiconductor device according to claim 6, wherein said coating insulating film is a silicon oxide film.

8. The semiconductor device according to claim 6, wherein said coating insulating film is a silicon oxynitride film.

9. The semiconductor device according to claim 1, wherein said semiconductor substrate is an SOI substrate which comprises,
   a buried insulating film provided on a silicon substrate, and
   an SOI layer provided on said buried insulating film,
   wherein said buried insulating film contains deuterium atoms.

10. A semiconductor device comprising a MOSFET which comprises,
    a gate insulating film provided on an active region defined by an element isolation insulating film provided in a main surface of a semiconductor substrate, and
    a gate electrode provided on said gate insulating film, said element isolation insulating film comprising,
    a trench formed in the main surface of said semiconductor substrate,
    an inner-wall insulating film provided on an inner wall of said trench and containing deuterium atoms, and
    an insulating film buried in said trench,
    wherein said trench is covered by said inner-wall insulating film.

11. The semiconductor device according to claim 10, wherein said inner-wall insulating film is a silicon oxide film which contains deuterium atoms or a silicon oxynitride film which contains deuterium atoms.

12. The semiconductor device according to claim 10, wherein said insulating film is a silicon oxide film which contains deuterium atoms or a silicon oxynitride film which contains deuterium atoms.

13. The semiconductor device according to claim 10, wherein said inner-wall insulating film has a top edge raised to form a gentle curve on the main surface of said semiconductor substrate and said gate electrode of said MOSFET has an edge in a gate width direction engaged with said top edge of said inner-wall insulating film.

14. The semiconductor device according to claim 10, wherein said semiconductor substrate is an SOI substrate which comprises, a buried insulating film provided on a silicon substrate, and an SOI layer provided on said buried insulating film, wherein said buried insulating film contains deuterium atoms.

15. A semiconductor device comprising at least a MOSFET provided on an SOI substrate comprising:

a buried insulating film provided on a silicon substrate, and an SOI layer provided on said buried insulating film, wherein said buried insulating film is a two-layer film comprising any two of a silicon oxide film, a silicon oxynitride film and a silicon nitride film, one film of said two-layer film is formed on the other film of said two-layer film, one film of said two-layer film is thicker than the other film of said two-layer film, and said buried insulating film contains deuterium atoms.

16. The semiconductor device according to claim 15, wherein said buried insulating film comprises a first layer adjacent to said SOI layer and a second layer underlying said first layer, and at least said first layer contains deuterium atoms.

17. The semiconductor device according to claim 16, wherein said first layer is said silicon oxide film or said silicon oxynitride film.

* * * * *